(12) United States Patent  
Narita et al.

(10) Patent No.: US 11,003,297 B2  
(45) Date of Patent: May 11, 2021

(54) METHOD OF MANUFACTURING CONDUCTIVE LAMINATE, CONDUCTIVE LAMINATE, AND TOUCH SENSOR

(71) Applicant: FUJIFILM Corporation, Tokyo (JP)

(72) Inventors: Takeshi Narita, Kanagawa (JP); Naoki Tsukamoto, Kanagawa (JP); Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/544,521

(22) Filed: Aug. 19, 2019

(65) Prior Publication Data

US 2019/0369812 A1 Dec. 5, 2019

Related U.S. Application Data

(63) Continuation of application No. PCT/JP2018/003476, filed on Feb. 1, 2018.

(30) Foreign Application Priority Data

Mar. 15, 2017 (JP) .............................. JP2017-049995

(51) Int. Cl.  
*G06F 3/044* (2006.01)  
*C23C 18/20* (2006.01)

(52) U.S. Cl.  
CPC .......... *G06F 3/0446* (2019.05); *C23C 18/204* (2013.01); *G06F 2203/04103* (2013.01)

(58) Field of Classification Search  
CPC . C23C 18/204; C23C 18/166; C23C 18/2033; C23C 14/562; G06F 2203/04103; G02F 1/133305  
See application file for complete search history.

(56) References Cited

U.S. PATENT DOCUMENTS

2009/0269599 A1 10/2009 Tsurumi  
2010/0080964 A1 4/2010 Kano et al.  
(Continued)

FOREIGN PATENT DOCUMENTS

JP 2006-135271 A 5/2006  
JP 2009-007540 A 1/2009  
(Continued)

OTHER PUBLICATIONS

An Office Action mailed by China National Intellectual Property Administration dated Jan. 29, 2021, which corresponds to Chinese Patent Application No. 201880013602.7 and is related to U.S. Appl. No. 16/544,521; with English language translation.  
(Continued)

*Primary Examiner* — Gerald Johnson  
(74) *Attorney, Agent, or Firm* — Studebaker & Brackett PC

(57) ABSTRACT

A method of manufacturing a conductive laminate includes extracting a long flexible substrate from a roll on which the flexible substrate is wound, forming a to-be-plated layer precursor layer on at least one main surface of the flexible substrate while the extracted flexible substrate is transported in the longitudinal direction, preparing a support, bonding the flexible substrate with a to-be-plated layer precursor layer to at least one main surface of the support, applying energy to the support with a to-be-plated layer precursor layer to obtain a support with a patterned layer to be plated, forming the support into a three-dimensional shape including a curved surface, and performing a plating treatment on the patterned layer to be plated to obtain the conductive laminate having a three-dimensional shape.

14 Claims, 7 Drawing Sheets

(56) References Cited

U.S. PATENT DOCUMENTS

| | | | |
|---|---|---|---|
| 2011/0047384 A1 | 2/2011 | Jacobs et al. | |
| 2012/0196131 A1* | 8/2012 | Eldada | B32B 9/04 428/411.1 |
| 2013/0335375 A1 | 12/2013 | Nishikawa et al. | |
| 2017/0136727 A1 | 5/2017 | Miyamoto | |
| 2018/0057943 A1 | 3/2018 | Tsukamoto | |
| 2018/0274101 A1* | 9/2018 | Kano | C23C 16/45544 |
| 2018/0282861 A1* | 10/2018 | Seo | H01L 51/0032 |

FOREIGN PATENT DOCUMENTS

| | | |
|---|---|---|
| JP | 2009-280905 A | 12/2009 |
| JP | 2012-242871 A | 12/2012 |
| JP | 2013-502654 A | 1/2013 |
| JP | 2016-213435 A | 12/2016 |
| WO | 2016/035542 A1 | 3/2016 |
| WO | 2016/181824 A1 | 11/2016 |

OTHER PUBLICATIONS

International Search Report issued in PCT/JP2018/003476; dated May 1, 2018.

International Preliminary Report on Patentability and Written Opinion issued in PCT/JP2018/003476; dated Sep. 17, 2019.

\* cited by examiner

METHOD OF MANUFACTURING CONDUCTIVE LAMINATE, CONDUCTIVE LAMINATE, AND TOUCH SENSOR

CROSS-REFERENCE TO RELATED APPLICATIONS

This application is a Continuation of PCT International Application No. PCT/JP2018/3476, filed on Feb. 1, 2018, which claims priority under 35 U.S.C. § 119(a) to Japanese Patent Application No. 2017-049995, filed on Mar. 15, 2017. Each of the above application(s) is hereby expressly incorporated by reference, in its entirety, into the present application.

BACKGROUND OF THE INVENTION

1. Field of the Invention

The present invention relates to a method of manufacturing a conductive laminate, a conductive laminate, and a touch sensor.

2. Description of the Related Art

A conductive laminate that has conductive thin wires (for example, metal thin wires) formed on a substrate is used in various applications. Particularly, in recent years, the demand for a conductive laminate for a capacitive touch sensor capable of multipoint detection is rapidly expanding according to the increase of the loading rate of touch panels or touch pads on mobile phones or portable game devices.

On the other hand, with the spread of touch panels or touch pads in recent years, the types of devices equipped with these are diversified, and in order to further enhance the operability of the devices, a touch panel or touch pad having a curved touch surface has been proposed.

WO2016/181824A discloses a method of manufacturing a conductive laminate having a three-dimensional shape including a curved surface including a step A of forming a patterned layer to-be-plated precursor layer having a functional group interacting with a plating catalyst or a precursor thereof and a polymerizable group on a substrate so as to obtain a substrate with a to-be-plated layer precursor layer, a step B of deforming the substrate with a to-be-plated layer precursor layer such that at least a portion of the to-be-plated layer precursor layer is deformed, so as to form a three-dimensional shape including a curved surface, a step C of applying energy to the to-be-plated layer precursor layer so as to form a patterned layer to be plated, and a step D of performing a plating treatment on the patterned layer to be plated and forming a patterned metal layer on the plated layer, in which, after the step C and before the step D, a step E of applying a plating catalyst or a precursor thereof to a patterned layer to be plated is further provided, or the plating catalyst the precursor thereof is included in the patterned layer to-be-plated precursor layer of the step A.

SUMMARY OF THE INVENTION

The inventors of the present invention confirmed that, according to the method disclosed in WO2016/181824A, it is possible to easily manufacture a conductive laminate having a three-dimensional shape including a curved surface and having a metal layer disposed on the curved surface. Meanwhile, it was found that a touch sensor manufactured by using a conductive laminate manufactured by the above manufacturing method, and according to the use, a three-dimensional shape including a curved surface is deformed in some cases.

Here, an object of the present invention is to provide a method capable of easily manufacturing a conductive laminate that has a three-dimensional shape including a curved surface, that has a metal layer disposed on the curved surface thereof, and that is hardly deformed by external force.

The present invention is to provide a conductive laminate and a touch sensor.

The present inventors have diligently conducted research in order to achieve the above object and found that the above object can be achieved by the following configuration.

[1] A method of manufacturing a conductive laminate having a three-dimensional shape, the method comprising: a step A1 of extracting a long flexible substrate from a roll on which the flexible substrate is wound, and forming a to-be-plated layer precursor layer on at least one main surface of the flexible substrate while the extracted flexible substrate is transported in the longitudinal direction to obtain a flexible substrate with a to-be-plated layer precursor layer; a step B1 of preparing a support and bonding the flexible substrate with a to-be-plated layer precursor layer to at least one main surface of the support to obtain a support with a to-be-plated layer precursor layer; a step C1 of applying energy to the support with a to-be-plated layer precursor layer to obtain a support with a patterned layer to be plated; a step D1 of deforming the support with a patterned layer to be plated such that at least a portion of the patterned layer to be plated is deformed to form a three-dimensional shape including a curved surface; and a step E1 of performing a plating treatment on the patterned layer to be plated to form a patterned metal layer on the patterned layer to be plated, in which the to-be-plated layer precursor layer contains a functional group interacting with a plating catalyst or a precursor thereof and a polymerizable group, and a step F1 of applying a plating catalyst or a precursor thereof to the patterned layer to be plated is further provided before the plating treatment, or the to-be-plated layer precursor layer contains a plating catalyst or a precursor thereof.

[2] The method of manufacturing a conductive laminate having a three-dimensional shape according to [1], in which, in the step B1, the flexible substrates with a to-be-plated layer precursor layer are bonded to both main surfaces of the support.

[3] A method of manufacturing a conductive laminate having a three-dimensional shape, the method comprising: a step A2 of extracting a long flexible substrate from a roll on which the flexible substrate is wound, and forming a to-be-plated layer precursor layer on at least one main surface of the flexible substrate while the extracted flexible substrate is transported in the longitudinal direction to obtain a flexible substrate with a to-be-plated layer precursor layer; a step B2 of applying energy to the flexible substrate with a to-be-plated layer precursor layer to obtain a flexible substrate with a patterned layer to be plated; a step C2 of preparing a support and bonding the flexible substrate with a patterned layer to be plated on at least one main surface of the support to obtain a support with a patterned layer to be plated; a step D2 of deforming the support with a patterned layer to be plated such that at least a portion of the patterned layer to be plated is deformed to form a three-dimensional shape including a curved surface; and a step E2 of performing a plating treatment on the patterned layer to be plated and forming a patterned metal layer on the patterned layer to be plated, in which the to-be-plated layer precursor layer contains a functional group interacting with a plating catalyst or a precursor thereof and a polymerizable group, and a step F2 of applying a plating catalyst or a precursor thereof to the patterned layer to be plated is further provided before the plating treatment, or the patterned layer to-be-plated precursor layer contains a plating catalyst or a precursor thereof.

[4] The method of manufacturing a conductive laminate having a three-dimensional shape according to any one of [1] to [3], further comprising: dehydrating at least the support before the support with a patterned layer to be plated is deformed.

[5] The method of manufacturing a conductive laminate having a three-dimensional shape according to any one of [1] to [4], in which the to-be-plated layer precursor layer is formed by coating at least one main surface of the flexible substrate with a layer to be plated forming composition, in which the layer to be plated forming composition contains a compound X or a composition Y, the compound X is a compound having a functional group interacting with a plating catalyst or a precursor thereof and a polymerizable group, and the composition Y is a composition containing a compound having a functional group interacting with a plating catalyst or a precursor thereof and a compound having a polymerizable group.

[6] The method of manufacturing a conductive laminate having a three-dimensional shape according to any one of [1] to [5], in which a width of the patterned metal layer is 10 µm or less.

[7] A conductive laminate having a three-dimensional shape, comprising: a support having a three-dimensional shape including a curved surface; a flexible substrate disposed on at least one main surface of the support to follow a shape of the support; a patterned layer to be plated that is disposed on the flexible substrate and contains a plating catalyst or a precursor thereof; and a patterned metal layer disposed on the patterned layer to be plated.

[8] The conductive laminate having a three-dimensional shape according to [7], in which the flexible substrate are disposed on both main surfaces of the support, and the patterned layer to be plated, and the patterned metal layer disposed on the patterned layer to be plated are provided on each of two flexible substrates.

[9] The conductive laminate having a three-dimensional shape according to [7] or [8], in which a width of the patterned metal layer is 10 µm or less.

[10] A touch sensor comprising the conductive laminate having a three-dimensional shape according to any one of [7] to [9].

According to the present invention, it is possible to provide a conductive laminate having a three-dimensional shape including a curved surface, that has a metal layer disposed on the curved surface thereof, and that is hardly deformed by external force.

The present invention can provide a conductive laminate and a touch sensor.

DESCRIPTION OF THE PREFERRED EMBODIMENTS

Figure 1:
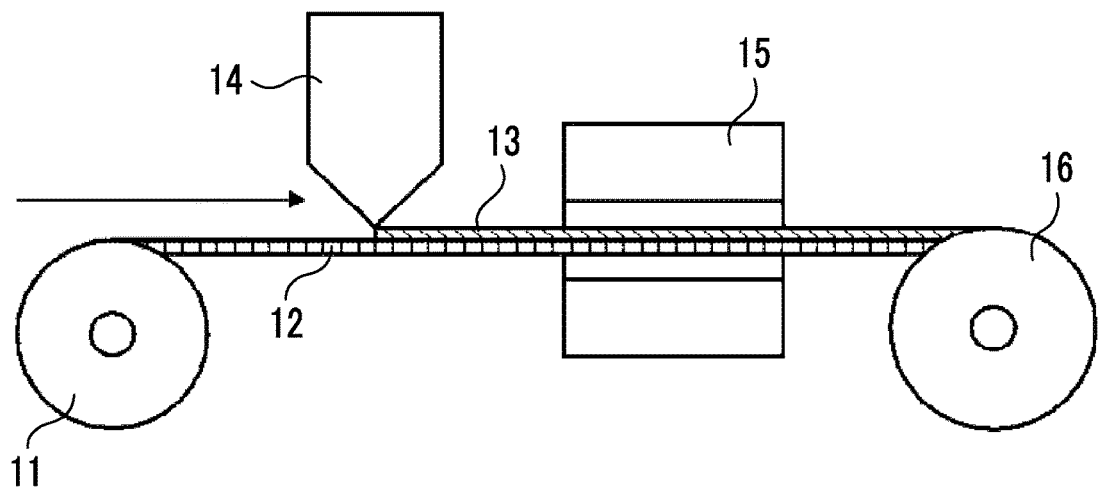
FIG. 1 is a schematic cross-sectional view for describing a step A1 according to a first embodiment according to the present invention.

Hereinafter, the present invention is specifically described.

In the present specification, a numerical range represented by using "to" means a range including numerical values described before and after "to" as a lower limit value and an upper limit value. The drawings in the present invention are schematic diagrams for better understanding of the present invention, and a thickness relationship or a positional relationship between respective layers and the like do not necessarily identical to the actual ones.

First Embodiment

Hereinafter, a first embodiment of a method of manufacturing a conductive laminate according to the embodiment of the present invention is described.

The first embodiment of the method of manufacturing the conductive laminate according to the embodiment of the present invention is a method of manufacturing a conductive laminate having a three-dimensional shape including a step A1 of extracting a flexible substrate from a roll on which the long flexible substrate is wound, forming a to-be-plated layer precursor layer on at least one main surface of the flexible substrate while the extracted flexible substrate is transported in the longitudinal direction, so as to obtain a flexible substrate with a to-be-plated layer precursor layer, a step B1 of preparing a support and bonding the flexible substrate with a to-be-plated layer precursor layer on at least one main surface of the support, so as to obtain a support with a to-be-plated layer precursor layer, a step C1 applying energy on the support with a to-be-plated layer precursor layer, so as to obtain a support with a patterned layer to be plated, a step D1 of deforming the support with a patterned layer to be plated such that at least a portion of the patterned layer to be plated is deformed, so as to form the support to have a three-dimensional shape including a curved surface, and a step E1 of performing a plating treatment on the patterned layer to be plated to form a patterned metal layer on the patterned layer to be plated, in which the to-be-plated layer precursor layer contains a plating catalyst or a functional group that interacts with a precursor thereof, and a polymerizable group, and a step F1 of applying the plating catalyst or the precursor thereof to the patterned layer to be plated before the plating treatment is further provided or the patterned layer to-be-plated precursor layer contains the plating catalyst or the precursor thereof.

Hereinafter, each step of the first embodiment and a material used in each step are described with reference to FIGS. 1 to 9.

[Step A1: Step of Obtaining Flexible Substrate with a to-be-Plated Layer Precursor Layer]

The step A1 is a step of obtaining the flexible substrate with a to-be-plated layer precursor layer, but an embodiment thereof, that is, a step of using a layer to be plated forming composition containing a compound containing a functional group (hereinafter, referred to as an "interactive group") that interacts with a plating catalyst or a precursor thereof or a composition (hereinafter, referred to as a "compound X" or a "composition Y") including the compound so as to obtain the flexible substrate with a to-be-plated layer precursor layer is described below.

Figure 2:
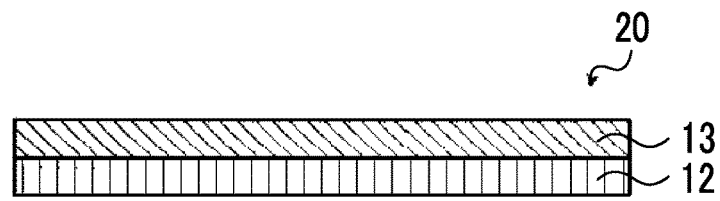
FIG. 2 is a schematic cross-sectional view of a flexible substrate with a to-be-plated layer precursor layer according to the first embodiment of the present invention.

FIG. 1 is a schematic cross-sectional view for describing the step A1, and FIG. 2 is a schematic cross-sectional view of a flexible substrate 20 with a to-be-plated layer precursor layer that can be obtained by the present step. Specifically, as illustrated in FIG. 1, the present step A1 is a step of extracting a long flexible substrate 12 from a roll 11 on which the long flexible substrate is wound, and forming a to-be-plated layer precursor layer 13 on at least one main surface of the long flexible substrate 12 while the extracted long flexible substrate 12 is transported in a longitudinal direction (a direction indicated by the arrow in FIG. 1), so as to obtain the flexible substrate 20 with a to-be-plated layer precursor layer.

The long flexible substrate 12 is not particularly limited, as long as the substrate can be formed in a three-dimensional shape having two main surfaces and including a curved surface and can be wound in a roll shape. The long flexible substrate 12 preferably has insulating properties and more preferably includes a resin.

Examples of the material of the long flexible substrate 12 include a polyether sulfone resin, a polyacrylic resin, a polyurethane resin, a polyester resin (polyethylene terephthalate, polyethylene naphthalate, and the like), a polycarbonate resin, a polysulfone resin, a polyamide resin, a polyarylate resin, a polyolefin resin, a cellulose resin, a polyvinyl chloride resin, and a cycloolefin resin. Among these, a thermoplastic resin is preferable, and polyethylene terephthalate, polymethyl methacrylate (PMMA), polycarbonate, or polyolefin-based resins are more preferable.

The thickness (mm) of the long flexible substrate 12 is not particularly limited, and is preferably 0.050 to 2.0 mm and more preferably 0.10 to 1.0 mm in view of balance between handleability and thinning.

The tensile modulus of elasticity of the long flexible substrate 12 is not particularly limited, but is preferably 0.400 to 5.00 GPa and more preferably 2.00 to 4.00 GPa in view of winding in a roll shape and excellent handleability. The tensile modulus of elasticity in the present specification refers to a tensile modulus of elasticity measured in conformity with JIS K7127:1999.

A relationship between the thickness (mm) and the tensile modulus of elasticity (GPa) of the flexible substrate is not particularly limited, but because the flexible substrate can be easily wound in a roll shape, it is preferable that a product $M_1$ of the thickness (mm) and the tensile modulus of elasticity (GPa) is 1.0 (GPa·mm) or less. Examples of the flexible substrate satisfying the above include a flexible substrate having a thickness of 0.40 mm and a tensile modulus of elasticity of 2.40 GPa.

The lower limit value of $M_1$ is not particularly limited, but generally, the lower limit value is preferably 0.02 (GPa·mm) or more.

A portion or all of the long flexible substrate 12 may have a multiple layer structure.

In a case where the long flexible substrate 12 has a multilayer structure, the flexible substrate may contain a polarizing plate, a phase difference film, cover plastic, a hard coat film, a barrier film, an adhesive film, an electromagnetic wave shielding film, a heat generating film, an antenna film, and a wiring film for devices other than a touch panel.

The width and the length of the long flexible substrate 12 are not particularly limited, and can be appropriately selected according to the purpose.

As illustrated in FIG. 1, the long flexible substrate 12 wound in a roll shape is extracted and transported in a longitudinal direction. A method of extracting and transporting the long flexible substrate 12 wound in a roll shape in a longitudinal direction is not particularly limited, and well-known methods can be used.

The to-be-plated layer precursor layer 13 is formed on the long flexible substrate 12 transported in the longitudinal direction. In FIG. 1, the long flexible substrate 12 is coated with the layer to be plated forming composition by using a coating device 14 so as to form the to-be-plated layer precursor layer 13, but the present invention is not limited to the above.

A method of coating the main surface of the long flexible substrate 12 with a layer to be plated forming composition is not particularly limited, and a well-known method can be used.

In FIG. 1, the to-be-plated layer precursor layer 13 formed on the long flexible substrate 12 is heated by a heating device 15. In a case where the to-be-plated layer precursor layer 13 formed on the long flexible substrate 12 is heated, in a case where the to-be-plated layer precursor layer 13 contains a solvent or the like, the solvent can be removed. At this point, generally, the heating temperature is preferably 70° C. to 130° C., and the heating time is preferably 0.5 to 5 minutes. In the method of manufacturing the conductive laminate illustrated in FIG. 1, the to-be-plated layer precursor layer 13 is heated, but in the method of manufacturing the conductive laminate according to the first embodiment of the present invention, the to-be-plated layer precursor layer 13 may not be heated.

The flexible substrate 20 with a to-be-plated layer precursor layer obtained as described above is wound on a roll 16, again. The flexible substrate 20 with a to-be-plated layer precursor layer has appropriate flexibility, and thus can be wound in a roll shape and preserved until the usage (performing the following step).

In the method of manufacturing the conductive laminate according to the first embodiment of the present invention, the flexible substrate 20 with a to-be-plated layer precursor layer may not be wound in a roll. In this case, the flexible substrate 20 with a to-be-plated layer precursor layer may be cut into a desired size.

The thickness of the to-be-plated layer precursor layer is not particularly limited, and generally, the thickness is preferably 0.3 to 1.2 m.

<Layer to be Plated Forming Composition>

Hereinafter, components contained in the layer to be plated forming composition are described.

The layer to be plated forming composition contains the compound X or the composition Y described below.

Compound X: A compound having a functional group (hereinafter, simply referred to as an "interactive group") that interacts with a plating catalyst or a precursor thereof and a polymerizable group Composition Y: A composition including a compound containing a functional group that interacts with a plating catalyst or a precursor thereof and a compound containing a polymerizable group (Compound X)

The compound X is a compound containing an interactive group and a polymerizable group.

The interactive group intends a functional group that can interact with a plating catalyst or a precursor thereof that is applied to the patterned layer to be plated, and for example, a functional group capable of forming electrostatic interaction with a plating catalyst or a precursor thereof, a nitrogen-containing functional group capable of forming a coordinate bond with a plating catalyst or a precursor thereof, a sulfur-containing functional group, or an oxygen-containing functional group can be used.

The interactive group is not particularly limited, and well-known interactive groups can be used. For example, as the interactive group, groups disclosed in paragraph 0021 of WO2016/181824A can be used.

In view of high polarity and high adsorption properties to a plating catalyst or a precursor thereof, the interactive group is particularly preferably an ionic polar group such as a carboxylic acid group, a sulfonic acid group, a phosphoric acid group, or a boronic acid group, an ether group, or a cyano group, and even more preferably a cyano group. The compound X may contain two or more kinds of interactive groups.

The polymerizable group is a functional group capable of forming a chemical bond by energy application, and examples thereof include a radically polymerizable group and a cationically polymerizable group. Among them, a radically polymerizable group is preferable in view of more excellent reactivity.

The radically polymerizable group is not particularly limited, and well-known radically polymerizable groups can be used, and for example, groups disclosed in paragraph 0022 of WO2016/181824A can be used. Among these, a methacryloyloxy group, an acryloyloxy group, a vinyl group, a styryl group, an acrylamide group, or a methacrylamide group is preferable, and a methacryloyloxy group, an acryloyloxy group, or a styryl group is more preferable.

The compound X may contain two or more kinds of polymerizable groups. The number of polymerizable groups contained in the compound X is not particularly limited, and one or more kinds thereof may be used.

The compound X may be a low molecular weight compound or may be a polymer compound. The low molecular weight compound intends a compound having a molecular weight of less than 1,000, and the polymer compound intends a compound having a molecular weight of 1,000 or more.

The low molecular weight compound having the polymerizable group corresponds to a so-called monomer. The polymer compound may be a polymer having a predetermined repeating unit.

As the compound X, only one kind may be used and two or more kinds may be used in combination.

In a case where the compound X is a polymer, the weight-average molecular weight of the polymer is not particularly limited, but is preferably 1,000 to 700,000 and more preferably 2,000 to 200,000, in view of more excellent handleability such as solubility. Particularly, in view of polymerization sensitivity, 20,000 or more is more preferable.

The method of synthesizing the polymer having the polymerizable group and the interactive group is not particularly limited, and well-known synthesis methods (see paragraphs <0097> to <0125> of JP2009-280905A) are used.

Preferred Embodiment 1 of Polymer

In a case where the compound X is a polymer, examples of one preferable embodiment thereof include a repeating unit having a polymerizable group represented by Formula (a) (hereinafter, appropriately referred to as a polymerizable group unit) and a copolymer containing a repeating unit (hereinafter, appropriately referred to as an interactive group unit) having an interactive group represented by Formula (b).

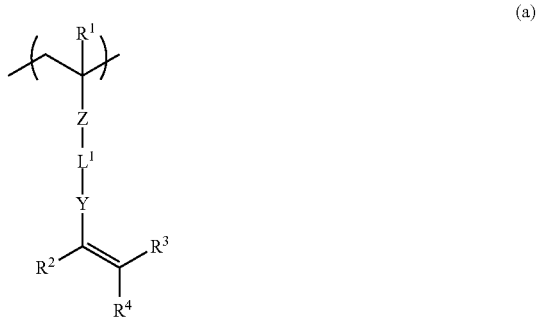

(a)

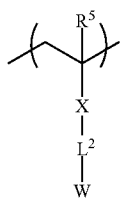

(b)

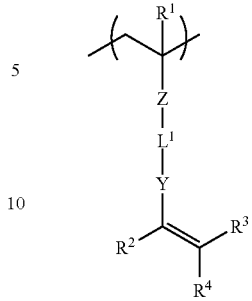

(A)

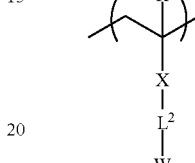

(B)

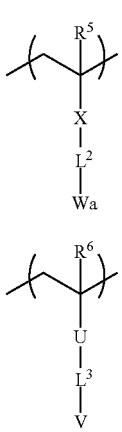

(C)

In Formulae (a) and (b), $R^1$ to $R^5$ each independently represent a hydrogen atom or a substituted or unsubstituted alkyl group (for example, a methyl group, an ethyl group, a propyl group, or a butyl group). The kinds of substituent are not particularly limited, and examples thereof include a methoxy group, a chlorine atom, a bromine atom, and a fluorine atom.

In Formulae (a) and (b), X, Y, and Z each independently represent a single bond or a substituted or unsubstituted divalent organic group. Examples of the divalent organic group include a substituted or unsubstituted divalent aliphatic hydrocarbon group (preferably having 1 to 8 carbon atoms, for example, an alkylene group such as a methylene group, an ethylene group, or a propylene group), a substituted or unsubstituted divalent aromatic hydrocarbon group (preferably having 6 to 12 carbon atoms, for example, a phenylene group), —O—, —S—, —SO$_2$—, —N(R)— (R: alkyl group), —CO—, —NH—, —COO—, —CONH—, and a combination thereof (for example, an alkyleneoxy group, an alkyleneoxy carbonyl group, or an alkylene carbonyloxy group).

In Formulae (a) and (b), $L^1$ and $L^2$ each independently represent a single bond or a substituted or unsubstituted divalent organic group. A definition of a divalent organic group is the same as that of the divalent organic group represented by X, Y, and Z described above.

In Formula (b), W represents an interactive group. The definition of the interactive group is as described above.

In view of reactivity (curability and polymerizability) and suppression of gelation in synthesis, the content of the polymerizable group unit is preferably 5 to 50 mol % and more preferably 5 to 40 mol % with respect to a total repeating unit in the polymer.

In view of adsorption to a plating catalyst or a precursor thereof, the content of the interactive group unit is preferably 5 to 95 mol % and more preferably 10 to 95 mol % with respect to the total repeating unit of the polymer.

Preferred Embodiment 2 of Polymer

In a case where the compound X is a polymer, examples of the second preferred embodiment include a copolymer including a repeating unit represented by Formulae (A), (B), and (C).

The repeating unit represented by Formula (A) is the same as the repeating unit represented by Formula (a), and the descriptions thereof are also the same.

$R^5$, X, and $L^2$ in the repeating unit represented by Formula (B) are the same as $R^5$, X, and $L^2$ in the repeating unit represented by Formula (b), and the descriptions thereof are also the same.

Wa in Formula (B) represents a group that interacts with a plating catalyst or a precursor thereof, except for a hydrophilic group represented by V or a precursor group thereof.

In Formula (C), $R^6$'s each independently represent a hydrogen atom or a substituted or unsubstituted alkyl group.

In Formula (C), U represents a single bond or a substituted or unsubstituted divalent organic group. The definition of the divalent organic group is the same as that of the divalent organic group represented by X, Y, and Z described above.

In Formula (C), $L^3$ represents a single bond or a substituted or unsubstituted divalent organic group. The definition of the divalent organic group is the same as that of the divalent organic group represented by $L^1$ and $L^2$ described above.

In Formula (C), V represents a hydrophilic group or a precursor group thereof. The hydrophilic group is not particularly limited as long as the hydrophilic group is a group exhibiting hydrophilicity, and examples thereof include a hydroxyl group and a carboxylic acid group. The precursor group of the hydrophilic group means a group that generates a hydrophilic group by a predetermined treatment (for example, treatment with an acid or an alkali), and examples thereof include a carboxyl group protected with THP (2-tetrahydropyranyl group).

The preferable content of each unit in the second preferred embodiment of the polymer is as follows.

In view of reactivity (curability and polymerizability) and suppression of gelation in synthesis, the content of the repeating unit represented by Formula (A) is preferably 5 to 50 mol % and more preferably 5 to 30 mol % with respect to the total repeating unit in the polymer.

In view of adsorption to a plating catalyst or a precursor thereof, the content of the repeating unit represented by Formula (B) is preferably 5 to 75 mol % and more preferably 10 to 70 mol % with respect to the total repeating unit in the polymer.

In view of the developability by an aqueous solution and moisture adhesiveness, the content of the repeating unit represented by Formula (C) is preferably 10 to 70 mol %, more preferably 20 to 60 mol %, and even more preferably 30 to 50 mol % with respect to the total repeating unit in the polymer.

Specific examples of a case where the compound X is a polymer include polymers disclosed in paragraphs 0106 to 0112 of JP2009-007540A, polymers disclosed in paragraphs 0065 to 0070 of JP2006-135271A, and polymers disclosed in paragraphs 0030 to 0108 of US2010-080964A.

The above polymers can be manufactured by a well-known method (for example, methods disclosed in the documents exemplified above).

Preferred Embodiment of Monomer

In a case where the compound X is a monomer, examples of the preferred embodiment thereof include a compound represented Formula (X).

(X)

In Formula (X), $R^{11}$ to $R^{13}$ each independently represent a hydrogen atom or a substituted or unsubstituted alkyl group. Examples of the unsubstituted alkyl group include a methyl group, an ethyl group, a propyl group, and a butyl group. Examples of the substituted alkyl group include a methoxy group and a methyl group, an ethyl group, a propyl group, and a butyl group which are substituted by a chlorine atom, a bromine atom, or a fluorine atom.

$L^{10}$ represents a single bond or a divalent organic group. Examples of the divalent organic group include a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —SO$_2$—, —N(R)— (R: alkyl group), —CO—, —NH—, —COO—, —CONH—, and a group obtained by combining these (for example, an alkyleneoxy group, an alkyleneoxy carbonyl group, and an alkylene carbonyloxy group).

W represents an interactive group. The definition of the interactive group is as described above.

(Composition Y)

The composition Y is a composition including a compound having an interactive group and a compound having a polymerizable group. That is, a to-be-plated layer precursor layer formed of the composition Y includes two compounds: a compound having an interactive group and a compound having a polymerizable group. The definitions of the interactive group and the polymerizable group are as described above.

The compound may be a low molecular weight compound or a polymer compound. Examples of the preferred embodiment of the compound having an interactive group include a polymer (for example, polyacrylic acid) having a repeating unit represented by Formula (b). The compound having an interactive group does not include a polymerizable group.

The compound having a polymerizable group is a so-called monomer, and in view of excellent hardness of the formed patterned layer to be plated, a polyfunctional monomer having two or more polymerizable groups is preferable. Specifically, it is preferable to use a monomer having 2 to 6 polymerizable groups as the polyfunctional monomer. In view of molecular mobility in the crosslinking reaction that affects the reactivity, the molecular weight of the polyfunctional monomer used is preferably 150 to 1,000 and more preferably 200 to 800. The distance between the plurality of polymerizable groups is preferably 1 to 15 in terms of the number of atoms.

The compound having a polymerizable group may include an interactive group.

As one of the preferred embodiment of the compound having a polymerizable group, a compound represented by Formula (1) is described below.

$Q\text{-}(\text{-}L\text{-}R_{20})_n$ (1)

In Formula (1), $R_{20}$ represents a polymerizable group.

L represents a single bond or a divalent organic group. The definition of the divalent organic group is as described above.

Q represents an n-valent organic group. Preferable examples of the n-valent organic group include an n-valent organic group formed of a group represented by Formula (1A), a group represented by Formula (1B),

(1A)

(1B)

—NH—, —NR (R: alkyl group)-, —O—, —S—, a carbonyl group, an alkylene group, an alkenylene group, an alkynylene group, a cycloalkylene group, an aromatic group, a heterocyclic group, and a group by combining two or more kinds of these. n represents an integer of 2 or more and preferably 2 to 6.

Among the above polyfunctional monomers, it is preferable that polyfunctional (meth)acrylamide is used because the hardness of the formed plated layer is excellent.

The polyfunctional (meth)acrylamide is not particularly limited as long as the polyfunctional (meth)acrylamide has two or more (preferably 2 to 6) (meth)acrylamide groups.

Among these, it is preferable that the polyfunctional (meth) acrylamide compound is a compound represented by Formula (2), because stretchability of the plated layer is more excellent.

In Formula (2), A represents an alkylene group. The number of carbon atoms in the alkylene group is not particularly limited, but is preferably 1 to 4 and more preferably 2 to 3. For example, in a case where A is an alkylene group having one carbon atom, -(A-O)— represents an oxymethylene group (—CH$_2$O—), in a case where A has two or more carbon atoms, -(A-O)— represents an oxyethylene group (—CH$_2$CH$_2$O—), and in a case where A is an alkylene group having 3 carbon atoms, -(A-O)— represents an oxypropylene group (—CH$_2$CH(CH$_3$)O—, —CH(CH$_3$)CH$_2$O—, or —CH$_2$CH$_2$CH$_2$O—). The alkylene group may be linear or branched.

In Formula (2), m represents a repeating number of the oxyalkylene group and represents an integer of 2 or more. The repeating number is not particularly limited, but is preferably 2 to 10 and more preferably 2 to 6.

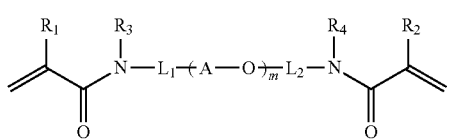

(2)

In Formula (2), R$_1$ and R$_2$ each independently represent a hydrogen atom or a methyl group.

R$_3$ and R$_4$ each independently represent a hydrogen atom or a substituent. The kinds of substituent are not particularly limited, and examples thereof include well-known substituents (for example, aliphatic hydrocarbon groups and aromatic hydrocarbon groups which may contain hetero atoms, and more specifically, an alkyl group, an aryl group, and the like).

In Formula (2), L$_1$ and L$_2$ each independently represent a single bond or a divalent linking group.

The divalent linking group is not particularly limited, but examples thereof include a divalent hydrocarbon group (a divalent saturated hydrocarbon group or a divalent aromatic hydrocarbon group. The divalent saturated hydrocarbon group may be linear, branched or cyclic, and preferably has 1 to 20 carbon atoms, and examples thereof include an alkylene group. The divalent aromatic hydrocarbon group preferably has 5 to 20 carbon atoms, and examples thereof include a phenylene group. In addition to the above, an alkenylene group or an alkynylene group may be used), a divalent heterocyclic group, —O—, —S—, —SO$_2$—, —NR$_{10}$—, —CO—(—C(=O)—), —COO—(—C(=O)O—), —NR$_{10}$—CO—, —CO—NR$_{10}$—, —SO$_3$—, —SO$_2$NR$_{10}$—, and a group obtained by combining two or more of these. Here, R$_{10}$ represents a hydrogen atom or an alkyl group (preferably having 1 to 10 carbon atoms).

The hydrogen atom in the divalent linking group may be substituted with another substituent such as a halogen atom.

Examples of the preferred embodiment of the compound represented by Formula (2) include a compound represented by Formula (3).

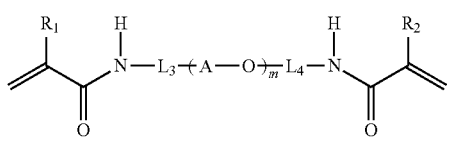

(3)

The definitions of R$_1$, R$_2$, A, and m in Formula (3) are the same as each group in Formula (2).

L$_3$ and L$_4$ each independently represent —O—, an alkylene group having 1 to 4 carbon atoms, a group represented by Formula (D), or a divalent linking group obtained by combining these.

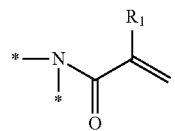

Formula D

In Formula (D), R$_1$ represents a hydrogen atom or a methyl group.

* represents a bonding position.

As the above amide compounds, various commercially available products can be used, or the amide compounds can be synthesized by the method disclosed in JP2013-502654A.

The mass ratio (the mass of the compound having an interactive group/the mass of the compound having a polymerizable group) of the compound having an interactive group to the compound having a polymerizable group is not particularly limited, but is preferably 0.1 to 10 and more preferably 0.5 to 5 in view of balance between the strength and plating suitability of the formed patterned layer to be plated.

The content of the compound X (or the composition Y) in the to-be-plated layer precursor layer is not particularly limited, but is preferably 50 mass % or more and more preferably 80 mass % or more with respect to 100% by mass of the total solid content in the layer to be plated forming composition. The upper limit is not particularly limited, but is preferably 99.5 mass % or less.

The to-be-plated layer precursor layer may include components other than the compound X and the composition Y. The to-be-plated layer precursor layer may include a polymerization initiator. In a case where the to-be-plated layer precursor layer includes a polymerization initiator, the reaction between the polymerizable groups in the exposure treatment more efficiently proceeds.

The polymerization initiator is not particularly limited, and well-known polymerization initiators (so-called photopolymerization initiators) may be used. Examples of polymerization initiators include benzophenones, acetophenones, α-aminoalkylphenones, benzoins, ketones, thioxanthones, benzyls, benzil ketals, oxsim esters, anthrones, tetramethylthiuram monosulfides, bisacyl phosphinoxides, acyl phosphine oxides, anthraquinones, an azo compound, and derivatives thereof.

The content of the polymerization initiator in the to-be-plated layer precursor layer is not particularly limited, but is preferably 0.01 to 1 mass % and more preferably 0.1 to 0.5 mass % with respect to 100 mass % of the total solid content in the layer to be plated forming composition, in view of the curability of the plated layer.

Other additives (for example, an organic solvent, a sensitizing agent, a curing agent, a polymerization inhibitor, an antioxidant, an antistatic agent, a filler, particles, a flame retardant, a lubricant, or a plasticizer) may be added to the to-be-plated layer precursor layer, if necessary.

Particularly, in a case where an organic solvent is contained, a hydrophilic solvent such as isopropanol or propylene glycol-1-monomethyl ether-2-acetate is preferable, because the function of a silicone-based surfactant or a fluorine-based surfactant among the above surfactants is further exhibited.

[Step B1: Step of Obtaining Support with to-be-Plated Layer Precursor Layer]

The step B1 is a step of preparing a support and bonding the flexible substrate with a to-be-plated layer precursor layer to at least one main surface of the support to obtain the support with a to-be-plated layer precursor layer.

Figure 3:
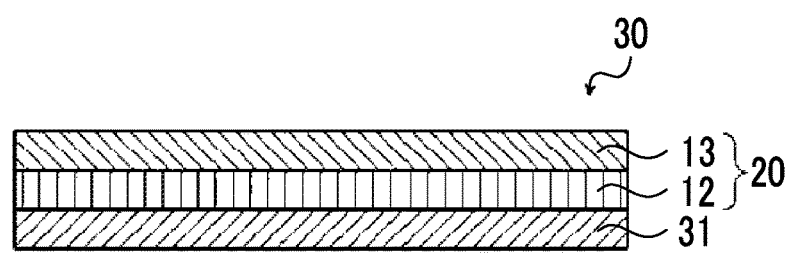
FIG. 3 is a schematic cross-sectional view of a support with a to-be-plated layer precursor layer according to the first embodiment of the present invention.

FIG. 3 is a schematic cross-sectional view of a support 30 with a to-be-plated layer precursor layer that can be obtained in the step B1.

In the support 30 with a to-be-plated layer precursor layer illustrated in FIG. 3, the flexible substrate 20 with a to-be-plated layer precursor layer is laminated on one main surface on a support 31 side.

In the step B1, first, a support is prepared. The preparation in the present specification intends for purchase or manufacture. The support is not particularly limited as long as the support can be formed into a three-dimensional shape having two main surfaces and including a curved surface, and has self-supporting properties. The support preferably has insulating properties and is more preferably formed of a resin.

The material of the support is not particularly limited, and well-known materials can be used. Examples of the material of the support include materials described above as the material of the flexible substrate.

The thickness (mm) of the support 31 is not particularly limited but is preferably 0.20 mm or more and more preferably 0.50 mm or more, because the obtained conductive laminate having a three-dimensional shape has more excellent self-supporting properties. Meanwhile, the thickness is preferably 5.0 mm or less and more preferably 2.5 mm or less, because a three-dimensional shape can be easily formed by deformation.

The tensile modulus of elasticity of the support 31 is not particularly limited, but is preferably 1.00 to 4.50 GPa and more preferably 2.00 to 4.00 GPa in that the conductive laminate having a three-dimensional shape has more excellent self-supporting properties.

The relationship between the thickness (mm) of the tensile modulus of elasticity (GPa) of the support is not particularly limited, but is selected to satisfy the following formula, because a conductive laminate that is capable of supporting the flexible substrate and has a three-dimensional shape having more excellent self-supporting properties can be obtained.

(Formula) $M_1+M_2$ 2.0

In the formula, $M_1$ represents a product (unit: GPa-mm) of the thickness (mm) and the tensile modulus of elasticity (GPa) of the flexible substrate, and $M_2$ represents a product (unit: GPa-mm) of the thickness (mm) and the tensile modulus of elasticity (GPa) of the support.

Examples of the combination of the flexible substrate and the support that satisfies the formula include a flexible substrate having a thickness of 0.40 mm, a tensile modulus of elasticity of 2.40 GPa and a support having a thickness of 1.0 mm and a tensile modulus of elasticity of 2.40 GPa.

The upper limit value of $M_1+M_2$ is not particularly limited, but is preferably 24 or less and more preferably 6.0 or less.

In a case where the conductive laminate having a three-dimensional shape comprises two or more flexible substrates, $M_1$ represents a sum of $M_1$'s of the flexible substrates. For example, in a case where a conductive laminate having a three-dimensional shape comprises two flexible substrates having a thickness of 0.40 mm and a tensile modulus of elasticity of 2.40 GPa, and a support having a thickness of 1.0 mm and a tensile modulus of elasticity of 2.40 GPa, $M_1+M_2=(0.96+0.96)+2.40=4.3$ (rounded off to two significant digits).

The support 31 may have a multilayer structure in part or in whole.

In a case where the support 31 has a multilayer structure, the flexible substrate may include a polarizing plate, a phase difference film, cover plastic, a hard coat film, a barrier film, an adhesive film, an electromagnetic shielding film, a heat generating film, an antenna film, and a wiring film for a device other than a touch panel.

A method of bonding the flexible substrate 20 with a to-be-plated layer precursor layer to a main surface of the support 31 is not particularly limited, but generally, examples thereof include a method of coating the main surface of the support 31, and/or the main surface of the flexible substrate 20 with a to-be-plated layer precursor layer with a pressure sensitive adhesive and bonding the main surfaces. At this point, the main surface that faces a side on which the to-be-plated layer precursor layer 13 of the flexible substrate 20 with a to-be-plated layer precursor layer is formed and one main surface of the support 31 are bonded to each other.

The pressure sensitive adhesive is not particularly limited, and well-known pressure sensitive adhesives can be used.

[Step C1: Step of Forming Patterned Layer to be Plated]

The step C1 is a step of applying energy to the to-be-plated layer precursor layer of the support with a to-be-plated layer precursor layer and curing the to-be-plated layer precursor layer, so as to form a patterned layer to be plated.

Figure 4:
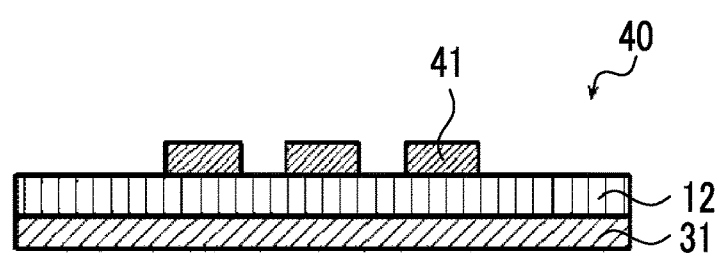
FIG. 4 is a schematic cross-sectional view of a support with a patterned layer to be plated according to the first embodiment of the present invention.
Figure 5:
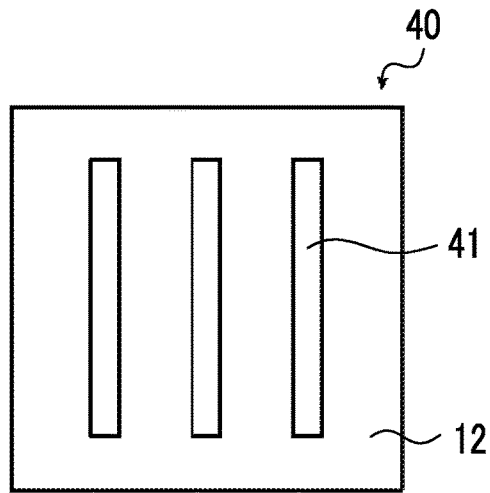
FIG. 5 is a top view of the support with a patterned layer to be plated according to the first embodiment of the present invention.

FIG. 4 is a schematic cross-sectional view of a support 40 with a patterned layer to be plated obtained in the step C1, and FIG. 5 is a top view of the support 40 with a patterned layer to be plated. In the support 40 with a patterned layer to be plated, a flexible substrate 12 and a patterned layer to be plated 41 are laminated in an order from the support 31 side. In FIGS. 4 and 5, the support 40 with a patterned layer to be plated comprises the patterned layer to be plated 41 formed of three parallel lines, but the support 40 with a patterned layer to be plated obtained in the step C1 is not limited thereto. The disposition of the plated layer 41 on the support can be appropriately changed according to the application of the obtained conductive laminate.

The plating catalyst or the precursor thereof in the step F1 described below according to the function of the interactive group is adsorbed in (is adhered to) the patterned layer to be plated 41. That is, the patterned layer to be plated 41 functions as a satisfactory receptive layer of the above plating catalyst or the precursor thereof. The polymerizable group is utilized for the bonding between compounds by a curing treatment by energy application, so as to obtain the patterned layer to be plated 41 having excellent toughness and hardness.

The method of applying the energy to the to-be-plated layer precursor layer 13 is not particularly limited. Examples thereof include a heat treatment and an exposure treatment (light irradiation treatment). Among these, the exposure treatment is preferable because the treatment is completed in a short period of time and a desired pattern can be easily obtained.

In a case where energy is applied to the to-be-plated layer precursor layer 13, the polymerizable group in the compound is activated, crosslinking between the compounds occurs, and curing of the layer proceeds.

The exposure method is not particularly limited, but examples thereof include a method of irradiating the to-be-plated layer precursor layer 13 with light or radiation via a photo mask comprising a desired pattern. Examples of the light source include a mercury lamp, a metal halide lamp, a xenon lamp, a chemical lamp, and a carbon arc lamp.

Examples of radiation include electron beams, X-rays, and ion beams. Specifically, examples thereof include scanning exposure with an infrared laser, high illuminance flash exposure by a xenon discharge lamp or the like, infrared lamp exposure.

The exposure time varies depending on the reactivity of the compound and the light source, but generally 10 seconds to 5 hours is preferable. The exposure energy is preferably 10 to 8,000 mJ/cm$^2$ and more preferably 50 to 3,000 mJ/cm$^2$.

In a case where the heat treatment is used for energy application, an blast dryer, an oven, an infrared dryer, a heating drum, or the like can be used.

The thickness of the formed patterned layer to be plated 41 is not particularly limited, but is preferably 10 to 5,000 nm and more preferably 100 to 2,000 nm, from the viewpoint of productivity.

Figure 20:
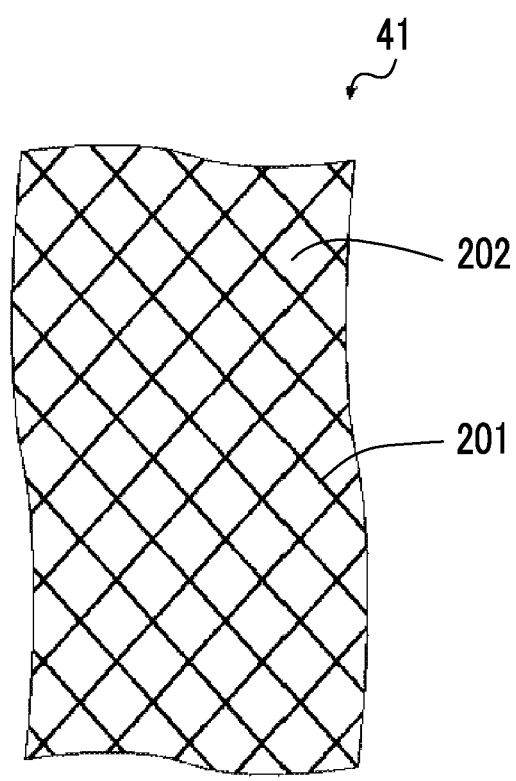
FIG. 20 is a partial enlarged view of the patterned layer to be plated.

FIG. 20 is a partial enlarged view of the patterned layer to be plated 41, and the patterned layer to be plated 41 contains a mesh-like pattern that is configured with a plurality of thin wires 201 and contains a plurality of lattices 202 formed of the intersecting thin wires 201.

A line width of the thin wires 201 is not particularly limited, but is preferably 20 μm or less, more preferably 10 μm or less, and even more preferably 8 μm or less, in view of the relationship with the line width of the formed metal layer.

The lower limit value of the line width of the thin wires 201 is not particularly limited, and generally, 0.01 μm or more is preferable.

In a case where the patterned layer to be plated 41 contains a mesh-like pattern, the metal layer described below contains the same mesh-like pattern. The conductive laminate having the metal layer formed in such a pattern shape can be appropriately used as a touch sensor. In FIG. 20, the lattice 202 has a substantially rhombus shape. However, other polygonal shapes (for example, triangles, squares, hexagons, and random polygons) may be used. For example, in addition to the straight line shape, the shape of one side may have an outwardly convex arc shape with respect to two sides facing each other and may have an inwardly convex arc shape with respect to the other two sides facing each other. The shape of each side may be a wavy line shape in which outwardly convex arcs and inwardly convex arc are continuously disposed. In FIG. 20, the patterned layer to be plated 41 contains a mesh-like pattern, but the present invention is not limited to the embodiment, and the pattern may be a stripe pattern as illustrated in FIG. 5.

[Step D1: Step of Forming Three-Dimensional Shape Including Curved Surface]

The step D1 is a step of deforming the support with a patterned layer to be plated such that at least a portion of the patterned layer to be plated is deformed so as to be formed into a desired three-dimensional shape including a curved surface. In other words, a portion in which the patterned layer to be plated, the flexible substrate, and the support are laminated is deformed (curved), the support with a patterned layer to be plated is deformed, so as to apply the desired three-dimensional shape including the curved surface to the plated layer, the flexible substrate, and the support. After the present step, a support with a plated layer having a patterned layer to be plated in which at least a portion of the surface is in a curved surface (in other words, that has a curved portion) can be obtained.

Figure 6:
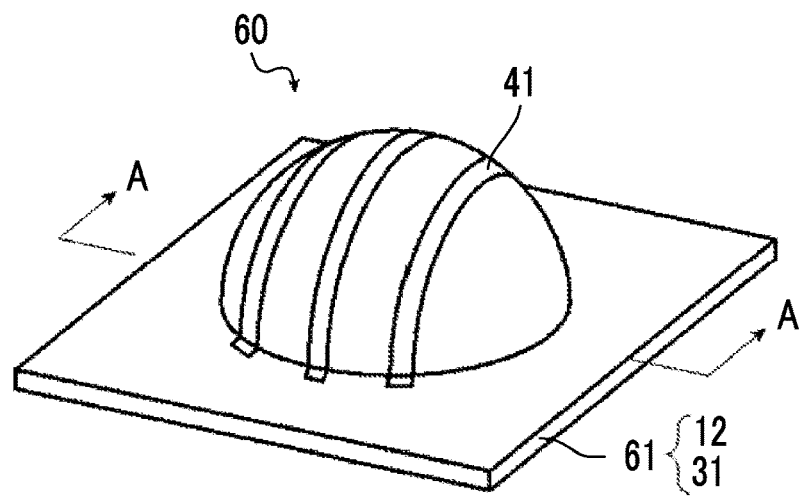
FIG. 6 is a perspective view of a support with a plated layer having a hemispherical shape according to the first embodiment of the present invention.
Figure 7:
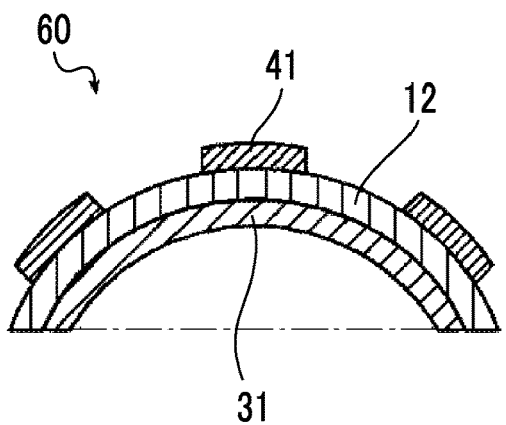
FIG. 7 is a cross-sectional view taken along the line A-A of the support with a plated layer having a hemispherical shape according to the first embodiment of the present invention.

FIGS. 6 and 7 illustrate schematic view describing the step D1. FIG. 6 is a perspective view of a support 60 with a plated layer formed into a hemispherical shape in the step D1, and FIG. 6 is a cross-sectional view thereof taken along the line A-A.

As understood from the comparison between FIGS. 4 and 6, in the present step, the support 31 is deformed (curved) such that at least a portion of the patterned layer to be plated 41 disposed on the support 31 is deformed (curved). In the support 40 with a patterned layer to be plated, because the flexible substrate 12 and the patterned layer to be plated 41 are laminated from the support 31, in a case where the support 31 is deformed, the flexible substrate 12 and the patterned layer to be plated 41 are deformed so as to follow the deformation of the support 31. In FIG. 6, a laminate of the support 31 and the flexible substrate 12 is illustrated as a support 61 with a flexible substrate.

In the step D1, a flat portion (particularly, a center portion in which the patterned layer to be plated 41 is disposed) of the support 31 is deformed in to a hemispherical shape, so as to form a hemispherical portion. According to the deformation, the support has a three-dimensional shape including a hemispherical portion and a flat part extending outward from the bottom surface of the hemispherical portion.

In FIGS. 6 and 7, a form in which the support is deformed into a hemispherical shape is illustrated, but the embodiment is not particularly limited, as long as a support having a three-dimensional shape including a curved surface is formed. Examples of the three-dimensional shape including a curved surface include a semi-cylindrical shape, a corrugated shape, a convex-concave shape, and a cylindrical shape.

In FIGS. 6 and 7, an embodiment in which a portion of the support with a plated layer is deformed so as to apply the three-dimensional shape including the curved surface to the support with a plated layer is illustrated, but the present invention is not limited to the embodiment, the entire support with a plated layer may be deformed.

The deformation method in the step D1 is not particularly limited, and for example, known methods such as vacuum forming, blow molding, free blow forming, pressure forming, vacuum-pressure forming, or heat press forming can be used. The heating temperature in a case of the deformation is preferably a temperature of equal to or higher than the thermal deformation temperature of the material of the support, and is in the temperature range higher than the glass transition temperature (Tg) of the support by 50° C. to 350° C. For example, the heating temperature is 170° C. to 270° C. in a case where the support is a (meth)acrylic resin and is about 250° C. to 320° C. in a case where the support is polycarbonate.

In a case of the forming, preheating may be performed to remove a distortion remaining on the support.

The thickness of the patterned layer to be plated to which the three-dimensional shape is applied is preferably 10 to 5,000 nm and more preferably 100 to 2,000 nm.

[Step F1: Step of applying plating catalyst, Step E1: step of forming patterned metal layer]

The step E1 is a step of performing a plating treatment on the patterned layer to be plated and forming a patterned metal layer on the patterned layer to be plated. In the method of manufacturing the conductive laminate according to the first embodiment of the present invention, before the step E1 is performed, the step F1 of applying the plating catalyst or the precursor thereof to the patterned layer to be plated is performed. The step F1 may be performed before the plating treatment, and an embodiment in which the step F1 is performed after the step D1 and before the step E1 is described below, but the step F1 may be performed after the step C1 and before the step D1. In view of manufacturing the conductive laminate more effectively, it is preferable that the step F1 is performed after the step D1 and before the step E1.

Figure 8:
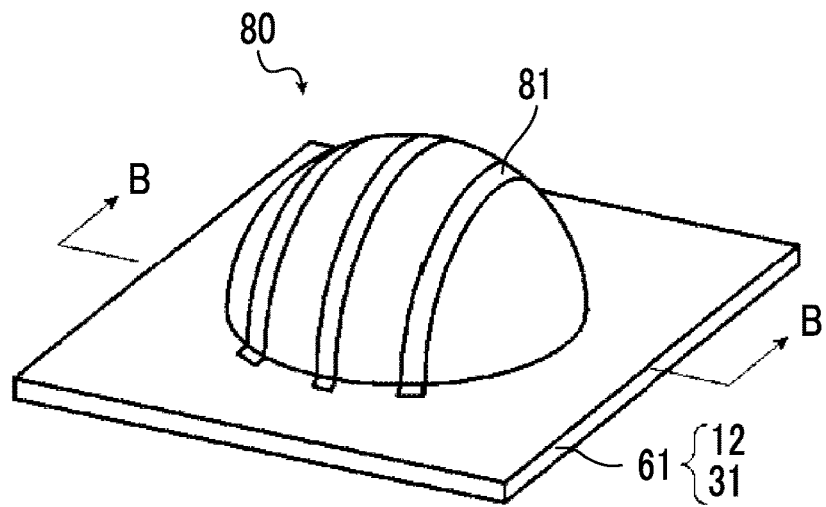
FIG. 8 is a perspective view of a conductive laminate having a hemispherical shape according to the first embodiment of the present invention.
Figure 9:
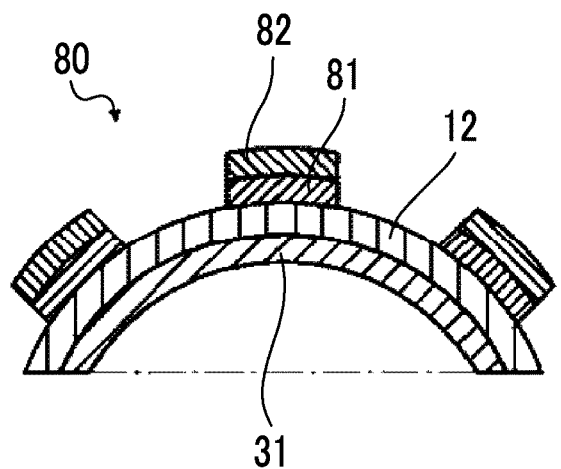
FIG. 9 is a cross-sectional view taken along the line B-B of the conductive laminate having the hemispherical shape according to the first embodiment of the present invention.

In FIGS. 8 and 9, schematic views for describing the step F1 and the step E1 are illustrated. FIG. 8 is a perspective view of a conductive laminate 80 having a hemispherical shape on which a patterned metal layer is laminated in the steps F1 and E1, and FIG. 9 is a cross-sectional view taken along the line B-B.

As illustrated in FIG. 9, it is possible to obtain the conductive laminate 80 in which a patterned metal layer 82 is laminated on a patterned layer to be plated 81 to which a plating catalyst or a precursor thereof is applied by applying the plating catalyst or the precursor thereof in the step F1 and performing a metal plating treatment in the step E1.

In the conductive laminate illustrated in FIGS. 8 and 9, the patterned metal layer 82 is formed only on an upper surface of the patterned layer to be plated 81 to which a plating catalyst or a precursor thereof is applied, but the present invention is not limited thereto, and the patterned metal layer may be formed on an upper surface and a side surface (that is, the entire surface of the patterned layer to be plated 81 to which a plating catalyst or a precursor thereof is applied) of the patterned layer to be plated 81 to which a plating catalyst or a precursor thereof is applied.

Hereinafter, first, a step (the step F1) of applying the plating catalyst or the precursor thereof to the patterned layer to be plated 41, so as to obtain the patterned layer to be plated 81 to which the plating catalyst or the precursor thereof is applied, and subsequently, a step (the step E1) of performing a plating treatment on the patterned layer to be plated 81 to which the plating catalyst or the precursor thereof is applied, so as to obtain the patterned metal layer 82.

<Step F1: Step of Applying Plating Catalyst>

In the present step, first, the plating catalyst or the precursor thereof is applied to the patterned layer to be plated 41. Since the patterned layer to be plated contains the interactive group, the interactive group adheres (adsorbs) the applied plating catalyst or the precursor thereof according to the function.

Specifically, the plating catalyst or the precursor thereof is applied to the surface of the patterned layer to be plated 41.

The plating catalyst or the precursor thereof functions as a catalyst or an electrode for the plating treatment.

Therefore, the kinds of the plating catalyst or the precursor thereof to be used are appropriately determined depending on the kinds of plating treatment.

The plating catalyst or the precursor thereof to be used is preferably an electroless plating catalyst or a precursor thereof. The electroless plating catalyst or the precursor thereof is mainly described below.

Any catalyst can be used as the electroless plating catalyst used in this step, as long as the catalyst becomes an active nucleus in a case of electroless plating, and specific examples thereof include metal (which are known as metal capable of electroless plating having a lower ionization tendency than Ni) having a catalytic ability for autocatalytic reduction reaction. Specific examples thereof include Pd, Ag, Cu, Ni, Pt, Au, and Co. Among these, Ag, Pd, Pt, or Cu is particularly preferable in view of high catalytic ability.

A metal colloid may be used as the electroless plating catalyst.

The electroless plating catalyst precursor used in this step can be used without particular limitation as long as the plating catalyst precursor can be an electroless plating catalyst by a chemical reaction. Metal ions of the metal exemplified above as the electroless plating catalyst are mainly used. The metal ion which is the electroless plating catalyst precursor becomes a zero-valent metal which is an electroless plating catalyst by a reduction reaction. After being applied to the patterned layer to be plated and before being immersed in the electroless plating bath, the metal ions that are the electroless plating catalyst precursors are converted to zero-valent metal by separate reduction reaction, so as to obtain electroless plating catalysts. Alternatively, the electroless plating catalyst precursor without change may be immersed in the electroless plating bath, and may be changed to a metal (electroless plating catalyst) by the reducing agent in the electroless plating bath.

As a method of applying the plating catalyst or the precursor thereof to the patterned layer to be plated 41, for example, a solution in which the plating catalyst or the precursor thereof is dispersed or dissolved in a suitable solvent is prepared, and the patterned layer to be plated is coated with the solution, or a laminate in which the patterned layer to be plated is formed is immersed in the solution.

Water or an organic solvent is suitably used as the solvent.

<Step E1: Plating Treatment Step>

Subsequently, a plating treatment is performed on the patterned layer to be plated 81 to which the plating catalyst or the precursor thereof is applied.

The method of plating treatment is not particularly limited, and examples thereof include an electroless plating treatment and an electrolytic plating treatment (electro plating treatment). In the present step, the electroless plating treatment may be performed alone, or the electrolytic plating treatment may be further performed after the electroless plating treatment is performed.

Orders of the electroless plating treatment and the electrolytic plating treatment are described below.

The electroless plating treatment refers to an operation of precipitating a metal by a chemical reaction by using a solution in which metal ions to be precipitated as plating are dissolved.

It is preferable that the electroless plating in the present step is performed, for example, by washing the laminate comprising the patterned layer to be plated to which the electroless plating catalyst is applied to remove an excess electroless plating catalyst (metal) and then immersing the laminate in an electroless plating bath. As the electroless plating bath used, a well-known electroless plating bath can be used.

In a case where the substrate comprising the patterned layer to be plated to which the electroless plating catalyst precursor is applied is immersed in an electroless plating bath in a state in which the electroless plating catalyst precursor is is adsorbed or impregnated in the patterned layer to be plated, it is preferable that the laminate is washed with water to remove excess electroless plating catalyst precursors (such as metal salt) and is immersed in an electroless plating bath.

The reduction of the electroless plating catalyst precursor can also be performed as a separate step before the electroless plating by preparing a catalyst activation solution (reduction solution) separately from the above embodiment in which the electroless plating solution is used.

As a composition of a general electroless plating bath, in addition to solvents (for example, water), 1. a metal ion for plating, 2. a reducing agent, and 3. an additive (stabilizers) for improving the stability of the metal ion are mainly included. In addition to these, the plating bath may include a well-known additive such as a stabilizer for the plating bath.

As an organic solvent used for an electroless plating bath, a solvent which is soluble in water is preferable. In this point, ketones such as acetone or alcohols such as methanol, ethanol, or isopropanol are preferably used. As the kinds of metal used for the electroless plating bath, copper, tin, lead, nickel, gold, silver, palladium, or rhodium is known, and among these, in view of conductivity, copper, silver, or gold is preferable, and copper is more preferable. A reducing agent and an additive are appropriately selected optimal according to the above metal.

The immersion time in the electroless plating bath is preferably about 1 minute to 6 hours and more preferably about 1 minute to 3 hours.

In the present step, in a case where the plating catalyst or the precursor thereof applied to the patterned layer to be plated 41 has a function as an electrode, electro plating can be performed on the patterned layer to be plated 81 to which the plating catalyst or the precursor thereof is applied.

As described above, in the present step, after the above electroless plating, an electrolytic plating treatment can be performed, if necessary. In the embodiment, the thickness of the formed patterned metal layer can be appropriately adjusted.

As illustrated in FIGS. 8 and 9, each of the conductive laminate obtained in the first embodiment has the support 31 having a hemispherical shape, the flexible substrate 12 on a peripheral curved surface of the support, the patterned layer to be plated 81 to which the plating catalyst or the precursor thereof is applied, and the patterned metal layer 82 disposed on the patterned layer to be plated.

The line width of the patterned metal layer 82 is not particularly limited, but generally, the line width is preferably 20 µm or less, and because the metal thin wire is hardly seen, the line width is more preferably 10 µm or less and even more preferably 8 µm or less. The lower limit value of the line width of the patterned metal layer 82 is not particularly limited, but generally, the lower limit value is preferably 0.01 µm or more.

The thickness of the patterned metal layer 82 is not particularly limited, and generally, the thickness is preferably 100 to 2,000 nm and more preferably 100 to 1,000 nm.

As described above, the conductive laminate can be applied to various applications, but for example, can be applied to a touch sensor (particularly, a capacitive touch sensor). In a case where the conductive laminate is applied to a touch sensor, the patterned metal layer can be caused to function as a so-called sensor electrode, and a lead wire (not illustrated) may be electrically connected to the end portion of the patterned metal layer.

[Additional Step]

The method for producing a conductive laminate according to the present embodiment may have a step in addition to the above as long as the effects of the present invention are exhibited. Examples of the step in addition to the above include a dehydration step and a primer layer formation step.

<Dehydration Step>

It is preferable that the method of manufacturing the conductive laminate further has at least a step of dehydrating the support before the deformation of the support with a patterned layer to be plated. The case "before the deformation of the support with a patterned layer to be plated" may be, for example, a case immediately before the step D1 and may be a case where the support is prepared in the step B 1.

The method of dehydrating the support is not particularly limited, but examples thereof include a heating and/or depressurizing method. The heating temperature is preferably 80° C. to 120° C., and the heating time is preferably 10 to 30 hours. The degree of pressure reduction is preferably −20 to −100 kPa as a gauge pressure at which the atmospheric pressure is 0 kPa.

In a case where the method of manufacturing the conductive laminate include a dehydration step, in a case where the support with a patterned layer to be plated is deformed, the foaming from the support or the flexible substrate can be suppressed, and the generation of peeling between the support and the flexible substrate can be further suppressed.

<Step of Forming Primer Layer>

The method of manufacturing the conductive laminate may perform a step of providing a primer layer on the flexible substrate 12 before the step A1 is performed. A primer layer is disposed between the flexible substrate 12 and the patterned layer to be plated 41 formed by exposure curing, so as to improve the adhesiveness therebetween.

Hereinafter, the primer layer is described.

The thickness of the primer layer is not particularly limited, and generally, the thickness is preferably 0.01 to 100 µm, more preferably 0.05 to 20 µm, and even more preferably 0.05 to 10 µm.

The material of the primer layer is not particularly limited, and a resin having satisfactory adhesiveness with the substrate is preferable. For example, the resin may be a thermosetting resin, a thermoplastic resin, or a mixture thereof. Examples of the thermosetting resin include an epoxy resin, a phenol resin, a polyimide resin, a polyester resin, a bismaleimide resin, a polyolefin-based resin, and an isocyanate-based resin. Examples of the thermoplastic resin include a phenoxy resin, polyether sulfone, polysulfone, polyphenylene sulfone, polyphenylene sulfide, polyphenyl ether, polyether imide, and an acrylonitrile-butadiene-styrene copolymer (ABS) resin.

The method of forming the primer layer is not particularly limited, and examples thereof include a method of laminating the resin used on the substrate or a method of dissolving a solvent that can dissolve required components, coating the surface of the substrate by a method such as coating, and performing drying.

First Modification Example of First Embodiment

A method of manufacturing a conductive laminate according to a first modification example of the first embodiment is described. In the first embodiment, an embodiment in which the metal layer is disposed only one surface side of the support is described, but the method of manufacturing the conductive laminate is not limited thereto, and the metal layer is disposed on both surfaces of the support.

That is, in the method of manufacturing the conductive laminate according to the first modification example of the first embodiment, the step B1 according to the first embodiment is a step B1-2 of bonding the flexible substrate with a to-be-plated layer precursor layer to both main surfaces of the support to obtain the support with a to-be-plated layer precursor layer.

The step A1 according to the first modification example of the first embodiment is the same as the step A1 of the first embodiment, and the description thereof is omitted. The material used in each step according to the first modification example of the first embodiment is the same as the material used in the first embodiment, and the description thereof is omitted.

[Step B1-2: Step of Obtaining Flexible Substrate with to-be-Plated Layer Precursor Layer]

Figure 10:
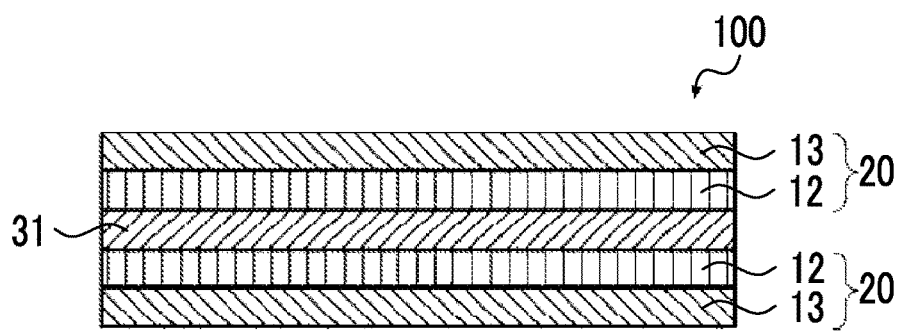
FIG. 10 is a schematic cross-sectional view of a support with a to-be-plated layer precursor layer according to a first modification example of the first embodiment of the present invention.

FIG. 10 is a schematic cross-sectional view of a support 100 with a to-be-plated layer precursor layer obtained in the step B1. In the support 100 with a to-be-plated layer precursor layer, the flexible substrate 20 with a to-be-plated layer precursor layer is laminated on the both main surfaces of the support 31.

The method of bonding the flexible substrate 20 with a to-be-plated layer precursor layer to the both main surfaces of the support 31 is not particularly limited, but generally, examples thereof include a method of coating the both main surfaces of the support 31 and/or the main surfaces of the flexible substrate 20 with a to-be-plated layer precursor layer with a pressure sensitive adhesive and performing bonding. At this point, the main surface that face a side on which the to-be-plated layer precursor layer 13 of the flexible substrate 20 with a to-be-plated layer precursor layer is formed and the main surfaces of the support 31 are bonded to each other.

[Step C1: Step of Forming Patterned Layer to be Plated]

Figure 11:
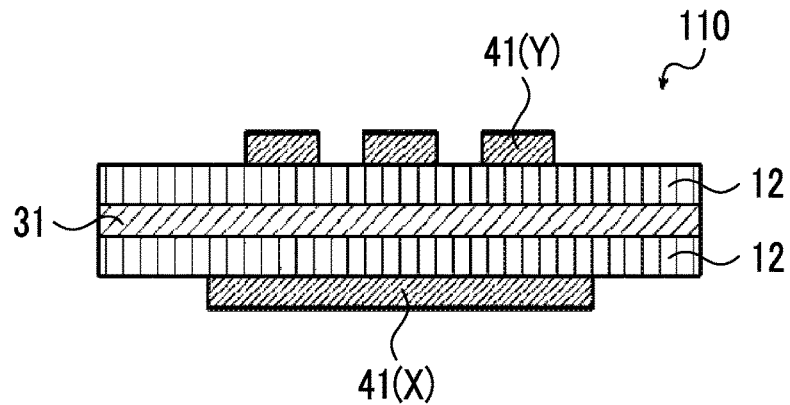
FIG. 11 is a schematic cross-sectional view of a support with a patterned layer to be plated according to the first modification example of the first embodiment of the present invention.
Figure 12:
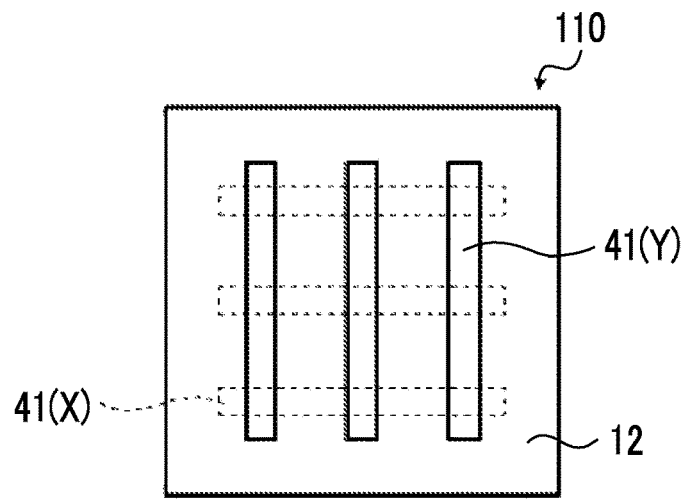
FIG. 12 is a top view of a support with a patterned layer to be plated according to the first modification example of the first embodiment of the present invention.

FIG. 11 is a schematic cross-sectional view of a support 110 with a patterned layer to be plated obtained in the step C1, and FIG. 12 is a top view of the support 110 with a patterned layer to be plated. In the support 110 with a patterned layer to be plated, each of the main surface of the support 31 comprises the flexible substrate 12, a patterned layer to be plated 41(Y), the flexible substrate 12, and a patterned layer to be plated 41(X), in an order from the support 31 side.

In FIGS. 11 and 12, the patterned layer to be plated 41(X) and the patterned layer to be plated 41(Y) disposed on both main surfaces of the support are disposed with a predetermined gap in two directions orthogonal to each other. In a case where the patterned layer to be plated is disposed as described above, in a case where a touch sensor is produced by using the obtained conductive laminate, a metal layer formed on the patterned layer to be plated 41(Y) and a metal layer formed on the patterned layer to be plated 41(X) function respectively as a first sensor electrode elongating in a first direction of the touch sensor and a second sensor electrode elongating in a second direction.

Figure 13:
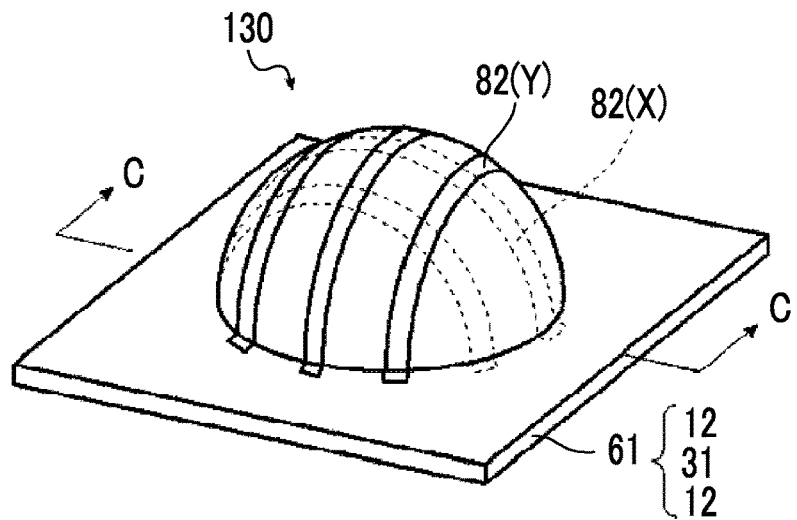
FIG. 13 is a perspective view of a conductive laminate having a hemispherical shape according to the first modification example of the first embodiment of the present invention.
Figure 14:
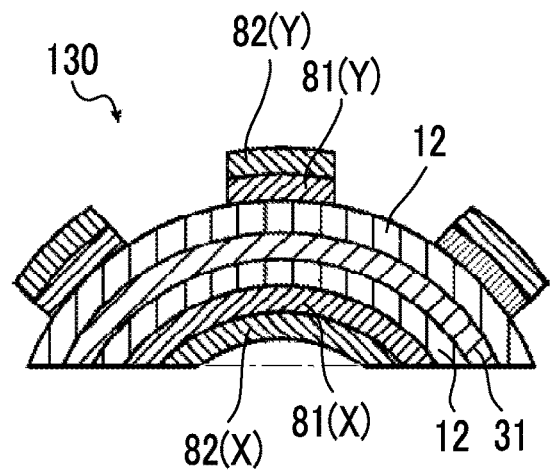
FIG. 14 is a cross-sectional view taken along the line C-C of the conductive laminate having the hemispherical shape according to the first modification example of the first embodiment of the present invention.

The subsequent steps (D1, E1, and F1) according to the present embodiment are the same as the respective steps according to the first embodiment, and are not specifically described, but FIGS. 13 and 14 are drawings for describing a conductive laminate having a hemispherical shape, which is obtained by the method of manufacturing the conductive laminate according to the present embodiment.

FIG. 13 is a perspective view of a conductive laminate 130 having a hemispherical shape, which is obtained by the method of manufacturing the conductive laminate according to the present embodiment, and FIG. 14 is a cross-sectional view taken along the line C-C of the conductive laminate 130.

In the conductive laminate 130, the flexible substrate 12, the patterned layer to be plated 81(Y) to which the plating catalyst or the precursor thereof is applied, the patterned metal layer 82(Y), the flexible substrate 12, the patterned layer to be plated 81(X) to which the plating catalyst or the precursor thereof is applied, and the patterned metal layer 82(X) are laminated on the both main surfaces of the support 31, in an order from the support 31 side. The conductive support is suitable for a touch sensor (particularly, a capacitive touch sensor).

Second Modification Example of First Embodiment

Hereinafter, the method manufacturing the conductive laminate according to a second modification example of the first embodiment is described. In the first embodiment, the embodiment having the step F 1 of applying the plating catalyst or the precursor thereof to the patterned layer to be plated is described, but the method of manufacturing the conductive laminate is not limited to the above, and the step A1 may be a step of extracting the flexible substrate from the roll on which the long flexible substrate is wound, and forming the to-be-plated layer precursor layer containing the plating catalyst or the precursor thereof on at least one main surface of the flexible substrate while the extracted flexible substrate is transported in the longitudinal direction, so as to obtain the flexible substrate with a to-be-plated layer precursor layer.

According to the above embodiment, because the to-be-plated layer precursor layer contains the plating catalyst or the precursor thereof, a conductive laminate can be manufactured without performing the step F1 described above, and thus the manufacturing process can be simplified.

Second Embodiment

The method of manufacturing the conductive laminate according to the second embodiment of the present invention is a method of manufacturing a conductive laminate having a three-dimensional shape, and the method includes a step A2 of extracting a flexible substrate from a roll on which a long flexible substrate is wound, and forming a to-be-plated layer precursor layer on at least one main surface of the flexible substrate while the extracted flexible substrate is transported in the longitudinal direction, so as to obtain the flexible substrate with a to-be-plated layer precursor layer, a step B2 of applying energy to the support with a to-be-plated layer precursor layer so as to obtain a flexible substrate with a patterned layer to be plated, a step C2 of preparing a support and bonding the flexible substrate with a patterned layer to be plated on at least one main surface of the support so as to obtain a support with a patterned layer to be plated, a step D2 of deforming the support with a patterned layer to be plated such that at least a portion of the patterned layer to be plated is deformed so as to form a three-dimensional shape including a curved surface, and a step E2 of performing a plating treatment on the patterned layer to be plated so as to form a patterned metal layer on the patterned layer to be plated, in which the to-be-plated layer precursor layer contains a functional group interacting with a plating catalyst or a precursor thereof and a polymerizable group, and a step F2 of applying a plating catalyst or a precursor thereof to the patterned layer to be plated is further provided before the plating treatment, or the patterned layer to-be-plated precursor layer contains a plating catalyst or a precursor thereof.

An order of the steps of the second embodiment is described with reference to FIGS. 15 to 17. An order and materials in the second embodiment which are not specifically described are the same as those in the first embodiment.

[Step A2: Step of Flexible Substrate with to-be-Plated Layer Precursor Layer]

The step A2 is a step of extracting the flexible substrate from the roll on which the long flexible substrate is wound, and forming the to-be-plated layer precursor layer on at least one main surface of the flexible substrate while the extracted flexible substrate is transported in the longitudinal direction, so as to obtain the flexible substrate with a to-be-plated layer precursor layer. An order and materials used in the step A2 of the second embodiment are the same as those in the step A1 of the first embodiment, and the description thereof is omitted.

[Step B2: Step of Obtaining Flexible Substrate with Patterned Layer to be Plated]

The step B2 is a step of applying energy to the flexible substrate with a to-be-plated layer precursor layer so as to obtain the flexible substrate with a patterned layer to be plated.

Figure 15:
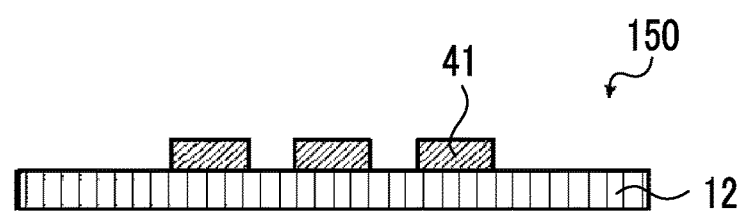
FIG. 15 is a schematic cross-sectional view of a flexible substrate with a patterned layer to be plated according to a second embodiment of the present invention.
Figure 16:
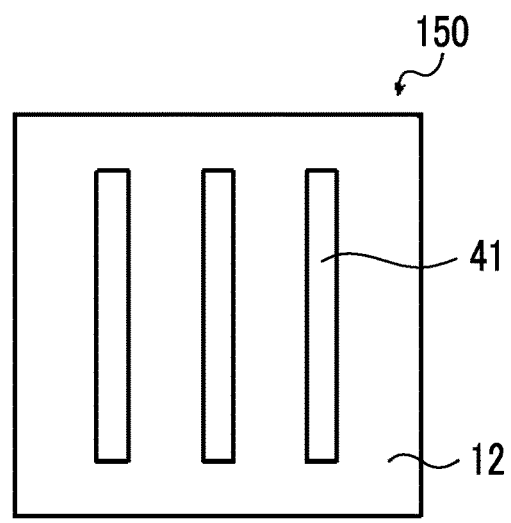
FIG. 16 is a top view of a flexible substrate with a patterned layer to be plated according to the second embodiment of the present invention.

FIG. 15 is a schematic cross-sectional view of a flexible substrate 150 with a patterned layer to be plated obtained in the step B2, and FIG. 16 is a top view of the flexible substrate 150 with a patterned layer to be plated. In the flexible substrate 150 with a patterned layer to be plated, the patterned layer to be plated 41 is laminated on one main surface of the flexible substrate 12. In FIGS. 15 and 16, the flexible substrate 150 with a patterned layer to be plated comprises the patterned layer to be plated 41 including three parallel lines, but the flexible substrate 150 with a patterned layer to be plated obtained in the step B2 is not limited thereto. The disposition of the plated layer 41 on the flexible substrate 12 can be appropriately changed according to the application of the obtained conductive laminate.

The method of applying the energy to the to-be-plated layer precursor layer 13 is not particularly limited. Conditions and methods thereof are as described in the step C1 of the first embodiment.

[Step C2: Step of Obtaining Support with Patterned Layer to be Plated]

The step C2 is a step of preparing the support, bonding the flexible substrate with a patterned layer to be plated to at least one main surface of the support, so as to obtain the support with a patterned layer to be plated.

Figure 17:
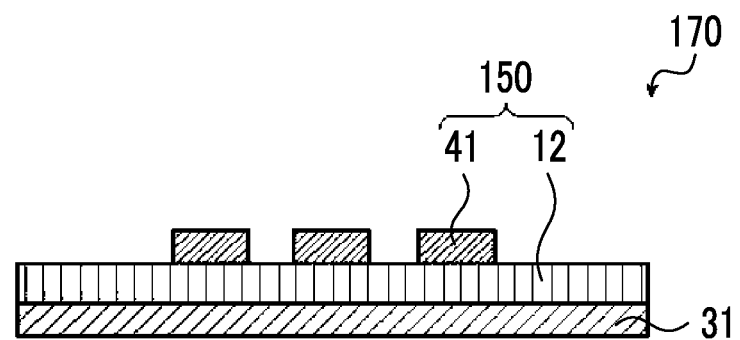
FIG. 17 is a schematic cross-sectional view of a support with a patterned layer to be plated according to the second embodiment of the present invention.

FIG. 17 is a schematic cross-sectional view of a support 170 with a patterned layer to be plated obtained in the step C1. In the support 170 with a patterned layer to be plated of FIG. 17, the flexible substrate 150 with a patterned layer to be plated is laminated on one main surface on the support 31 side.

In the step C2, first, a support is prepared. A method of preparing a support and a prepared support are as described in the step B1 of the first embodiment.

The method of bonding the flexible substrate 150 with a patterned layer to be plated to the main surface of the support 31 is not particularly limited, and generally, examples thereof include a method of coating the main surface of the support 31 and/or the main surface of the flexible substrate 150 with a patterned layer to be plated with a pressure sensitive adhesive and bonding the main surfaces to each other. At this point, the main surface that faces a side on which the patterned layer to be plated 41 of the flexible substrate 150 with a patterned layer to be plated is formed and one main surface of the support 31 are bonded to each other. The pressure sensitive adhesive is not particularly limited, and well-known adhesives can be used.

[Step D2: Step of Forming Three-Dimensional Shape Including Curved Surface]

The step D2 is a step of deforming the support with a patterned layer to be plated such that at least a portion of the patterned layer to be plated is deformed, and forming a three-dimensional shape including the curved surface. An order in the present step is the same as that in the step D1 of the first embodiment.

[Step F2: Step of Applying Plating Catalyst, Step E2: Step of Forming Patterned Metal Layer]

The step F2 is a step of applying the plating catalyst or the precursor thereof to the patterned layer to be plated before the plating treatment, and the step E2 is a step of performing a plating treatment to the patterned layer to be plated and forming the patterned metal layer on the patterned layer to be plated. An order in the above step is the same as that in the steps F1 and E1 in the first embodiment.

[Additional Step]

The method of manufacturing the conductive laminate according to the present embodiment may have a step in addition to the above, as long as the effect of the present invention is exhibited. Examples of the step in addition to the above include a dehydration step and a primer layer forming step.

<Dehydration Step>

It is preferable that the method of manufacturing the conductive laminate further has at least a step of dehydrating the support before the support with a patterned layer to plated is deformed. A case before the support with a patterned layer to be plated is deformed may be a case immediately before the step D2 and may be a case where the support is prepared in the step C2. An order of the dehydration is as described above as the dehydration step of the first embodiment.

<Primer Layer Forming Step>

The method of manufacturing the conductive laminate may perform a step of providing a primer layer on the flexible substrate 12 before the step A2 is performed. In a case where a primer layer is disposed between the flexible substrate 12 and the patterned layer to be plated 41 formed by exposure curing, adhesiveness of the both is enhanced. An order and materials used in the primer layer forming step are as described above as the primer layer forming step of the first embodiment.

First Modification Example of Second Embodiment

A method of manufacturing a conductive laminate according to the first modification example of the second embodiment is described. In the second embodiment, the embodiment in which a metal layer is disposed only one surface of the support is described, but the method of manufacturing the conductive laminate is not limited to the above, and a metal layer may be disposed on both sides of the support.

That is, in the method of manufacturing the conductive laminate according to the first modification example of the second embodiment, the step C2 according to the second embodiment is a step C2-2 of bonding the flexible substrate with a patterned layer to be plated to the both main surfaces of the support so as to obtain the support with a patterned layer to be plated.

The steps A2 and B2 according to the first modification example of the second embodiment are the same as the steps A2 and B2 according to the second embodiment, and the description thereof is omitted. The material used in each step of the first modification example of the second embodiment is the same as the material used in the second embodiment, and the description thereof is omitted.

[Step C2-2: Step of Obtaining Support with Patterned Layer to be Plated]

Figure 18:
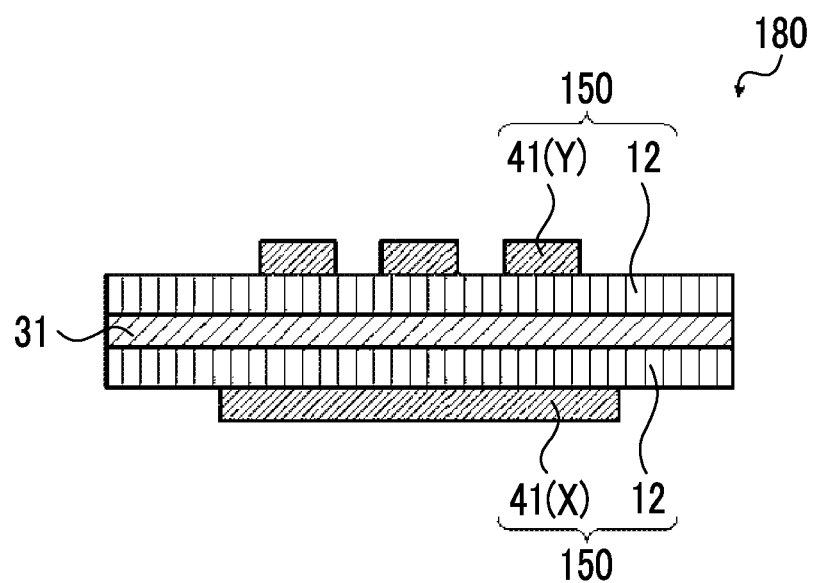
FIG. 18 is a schematic cross-sectional view of a support with a patterned layer to be plated according to a first modification example of the second embodiment of the present invention.
Figure 19:
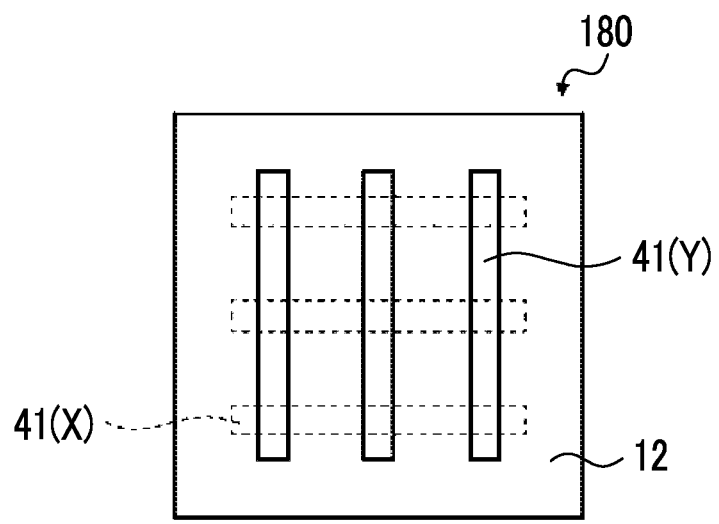
FIG. 19 is a top view of the support with a patterned layer to be plated according to the first modification example of the second embodiment of the present invention.

FIG. 18 is a schematic cross-sectional view of a support 180 with a patterned layer to be plated obtained in the step C2-2, and FIG. 19 is a top view of the support 180 with a patterned layer to be plated. In the support 180 with a patterned layer to be plated, the flexible substrate 150 with a patterned layer to be plated is laminated on the both main surfaces of the support 31.

At this point, in the support 180 with a patterned layer to be plated, each of the main surfaces of the support 31 includes the flexible substrate 12, the patterned layer to be plated 41(Y), the flexible substrate 12, and the patterned layer to be plated 41(X), in an order from the support 31 side.

In FIGS. 18 and 19, the patterned layer to be plated 41(X) and the patterned layer to be plated 41(Y) disposed on the both main surfaces of the support are disposed by a predetermined gap in two directions orthogonal to each other. In a case where the patterned layer to be plated is disposed as described above, in a case where a touch sensor is produced by using the obtained conductive laminate, a metal layer formed on the patterned layer to be plated 41(Y) and a metal layer formed on the patterned layer to be plated 41(X) function respectively as a first sensor electrode elongating in a first direction of the touch sensor and a second sensor electrode elongating in a second direction.

The subsequent steps (D2, E2, and F2) according to the present embodiment are the same as the respective steps according to the second embodiment.

Second Modification Example of Second Embodiment

Hereinafter, the method of manufacturing the conductive laminate according to a second modification example of the second embodiment is described. In the second embodiment, the embodiment of having the step F1 of applying the plating catalyst or the precursor thereof to the patterned layer to be plated is described, but the method of manufacturing the conductive laminate is not limited to the above, and the step A2 may be a step of extracting the flexible substrate from the roll on which the long flexible substrate is wound, and forming the to-be-plated layer precursor layer containing the plating catalyst or the precursor thereof on at least one main surface of the flexible substrate while the extracted flexible substrate is transported in the longitudinal direction, so as to obtain the flexible substrate with a to-be-plated layer precursor layer.

According to the above embodiment, because the to-be-plated layer precursor layer contains the plating catalyst or the precursor thereof, the conductive laminate can be manufactured without performing the step F1 described above, and thus the manufacturing process can be simplified.

EXAMPLES

Hereinafter, the present invention is specifically described with reference to the examples. Materials, amounts used, proportions, treatment contents, treatment procedures, and the like provided in the following examples can be appropriately changed without departing from the gist of the present invention. Accordingly, the scope of the present invention should not be construed in a limited manner by the following examples.

Example 1

(Preparation of Primer Layer Forming Composition)

The following components were mixed to obtain a primer layer forming composition.

Z913-3 (manufactured by Aica Kogyo Co., Ltd.): 33 mass %
IPA (isopropyl alcohol): 67 mass %

(Preparation of Layer to be Plated Forming Composition)

The following components were mixed to obtain a layer to be plated forming composition.

2-propanol: 87.31 mass %
Polyacrylic acid 25% aqueous solution (manufactured by Wako Pure Chemical Industries, Ltd.): 10.8 mass %
Compound A represented by the following formula: 1.8 mass %
IRGACURE 127 (manufactured by BASF SE): 0.09 mass %

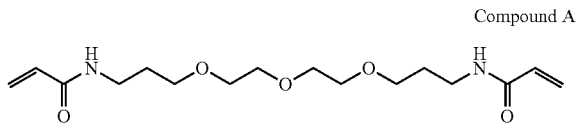 [SMILES: C=CC(=O)NCCCOCCOCCOCCCNC(=O)C=C]

Compound A

A polycarbonate film wound in a roll shape (corresponding to a flexible substrate, manufactured by Teijin Ltd. "PANLITE PC-2151", thickness: 125 μm, tensile modulus of elasticity 2.50 GPa, $M_1$=0.31 GPa-mm) was extracted and transported in the longitudinal direction, and one main surface of the polycarbonate film was coated with the primer layer forming composition such that the average dry film thickness was 1 μm and dried at 80° C. for three minutes, so as to form a primer layer forming composition layer. The formed primer layer forming composition layer was irradiated with ultraviolet light (UV) at an irradiation amount of 1,000 mJ to form a primer layer on a polycarbonate film.

Subsequently, the primer layer was coated with the layer to be plated forming composition, such that the average dry film thickness was 0.5 μm, to obtain a flexible substrate 1 with a to-be-plated layer precursor layer, and the flexible substrate was cut into a predetermined size. Subsequently, an acrylic plate having a thickness of 1.8 mm (corresponding to a support, tensile modulus of elasticity: 1.00 GPa, $M_2$=1.8 GPa-mm) was prepared, the cut flexible substrate 1 with a to-be-plated layer precursor layer was bonded on one main surface by using the pressure sensitive adhesive ("OCA 8172CL" manufactured by The 3M Company) such that the to-be-plated layer precursor layer was on the external side, so as to obtain the support 1 with a to-be-plated layer precursor layer ($M_1+M_2$=2.1).

Subsequently, by using a mask provided with a mesh-like wiring pattern, the support 1 with a to-be-plated layer precursor layer was subjected to UV irradiation (500 mJ/cm$^2$) with a high pressure mercury lamp. Subsequently, the support 1 with a to-be-plated layer precursor layer subjected to UV irradiation was developed by using an aqueous solution of sodium carbonate (1%), so as to obtain the support 1 with a patterned layer to be plated (patterned layer to be plated having a thickness of 0.5 μm and a line width of 6 μm).

Subsequently, the obtained support 1 with a patterned layer to be plated was placed in an oven at 100° C. and was dried under reduced pressure at a gauge pressure of −60 kPa for 24 hours.

After drying, the patterned portion of the obtained support 1 with a patterned layer to be plated was cut into a circular shape of 100 mmφ and is formed into a hemispherical shape by using a vacuum forming machine Formech 508 FS (manufactured by Nippon Seizuki Kogyo Co., Ltd.) by vacuum molding.

Subsequently, the Pd catalyst application liquid Omni Shield 1573 activator (manufactured by Rohm and Haas Electronic Materials LLC.) was diluted with pure water to 3.6 vol %, and the pH was adjusted to 4.0 with 0.1 N of HCl. The support 1 with a plated layer having a hemispherical shape was immersed at 45° C. for five minutes, and then was washed with pure water twice. Subsequently, the obtained support 1 with a plated layer having a hemispherical shape was immersed in a 0.8 vol % aqueous solution of a reducing agent circumposit PB oxide converter 60 C (manufactured by Rohm and Haas Electronic Materials LLC.) at 30° C. for five minutes, and then washed twice with pure water. Thereafter, the obtained support 1 with a plated layer having a hemispherical shape was bathed with an electroless plating solution by mixing 12 vol % of an agent M, 6 vol % of an agent A, and 10 vol % of an agent B of CIRCUPOSIT 4500 (manufactured by Rohm and Haas Electronic Materials LLC.), was immersed at 45° C. for 15 minutes, and was washed with pure water to form a patterned metal layer (thickness: 1.0 µm, line width: 8 µm), so as to obtain a conductive laminate 1 including a curved surface in a hemispherical shape.

The Omni Shield 1573 activator (manufactured by Rohm and Haas Electronic Materials LLC.) was diluted with pure water to 3.6 vol %, and the pH was adjusted to 4.0 with 0.1 N of HCl. The conductive laminate 1 was immersed in this aqueous solution for 30 seconds, was washed with water, and then was immersed in a 1 mass % aqueous solution (antirust treatment liquid) of a rust inhibitor (BT-120 manufactured by Johoku Chemical Co., Ltd.), and the conductive laminate 1 was washed with water.

The lead wiring portion of the comb wiring of the conductive laminate 1 having the hemispherical curved surface was masked and immersed in a hard coating solution (UVHC 5000 manufactured by Momentive Performance Materials Inc.), the above conductive laminate 1 coated with the hard coating solution was subjected to the UV irradiation (4,000 mJ), a hard coat layer was formed on the conductive laminate 1, and a flexible printed circuit (FPC) was crimped to the wiring portion.

It was checked whether the resultant was driven as a capacitive touch sensor to find that the resultant was driven without a problem, and the hemispherical portion was not broken even in a case where a 500 g of weight was placed.

Example 2

Two flexible substrates 1 with a to-be-plated layer precursor layers were manufactured in the same manner as in Example 1. Subsequently, an acrylic plate (corresponding to a support) having a thickness of 1.8 µm was prepared, and both main surfaces were bonded to the flexible substrates 1 with a to-be-plated layer precursor layers by using the pressure sensitive adhesive ("OCA 8172CL" manufactured by The 3M Company) such that to-be-plated layer precursor layer was on the external side, so as to obtain a support 2 with a to-be-plated layer precursor layer.

Subsequently, the support was sandwiched between one set of two masks manufactured to fit the drive pattern of True TOUCH Evaluation kit CYTK58 (touch driving integrated circuit (IC) manufactured by Cypress Semiconductor Corporation), and UV irradiation (5,000 mJ) was performed with a high pressure mercury lamp. Subsequently, the support 2 with a to-be-plated layer precursor layer subjected to UV irradiation was developed by using an aqueous solution (1%) of sodium carbonate, so as to obtain the support 2 with a patterned layer to be plated in which the patterned layers to be plated (thickness: 0.5 µm, line width: 6 µm) were formed.

Subsequently, the obtained support 2 with a patterned layer to be plated was dried by the same method as that performed on the support 1 with a patterned layer to be plated in Example 1, and then was deformed into a hemispherical shape.

Subsequently, the Pd catalyst application liquid Omni Shield 1573 activator (manufactured by Rohm and Haas Electronic Materials LLC.) was diluted with pure water to 3.6 vol %, and the pH was adjusted to 4.0 with 0.1 N of HCl. The support 1 with a plated layer having a hemispherical shape was immersed in this aqueous solution at 45° C. for five minutes, and then washed twice with pure water. Subsequently, the obtained support 2 with a plated layer having a hemispherical shape was immersed in a 0.8 vol % aqueous solution of a reducing agent circumposit PB oxide converter 60 C (manufactured by Rohm and Haas Electronic Materials LLC.) at 30° C. for five minutes and then washed twice with pure water. Thereafter, the obtained support 2 with a plated layer was bathed with an electroless plating solution by mixing 12 vol % of an agent M, 6 vol % of an agent A, and 10 vol % of an agent B of CIRCUPOSIT 4500 (manufactured by Rohm and Haas Electronic Materials LLC.), was immersed at 45° C. for 15 minutes, and was washed with pure water to form a patterned metal layer (thickness: 1.0 µm, line width: 8 µm), so as to obtain a conductive laminate 2 including a curved surface in a hemispherical shape.

The Omni Shield 1573 activator (manufactured by Rohm and Haas Electronic Materials LLC.) was diluted with pure water to 3.6 vol %, and the pH was adjusted to 4.0 with 0.1 N of HCl. The conductive laminate 2 was immersed in this aqueous solution for 30 seconds, was washed with water, and then was immersed in a 1 mass % aqueous solution (antirust treatment liquid) of a rust inhibitor (BT-120 manufactured by Johoku Chemical Co., Ltd.), and the conductive laminate 2 was washed with water.

The lead wiring portion of the comb wiring of the conductive laminate 2 having the hemispherical curved surface was masked and immersed in a hard coating solution (UVHC 5000 manufactured by Momentive Performance Materials Inc.), the above conductive laminate 1 coated with the hard coating solution was subjected to the UV irradiation (4,000 mJ), hard coat layers were formed on both main surfaces of the conductive laminate 2, and an FPC was crimped to the wiring portion.

It was checked whether the resultant was driven as a capacitive touch sensor to find that the sensor was driven without a problem, and the hemispherical portion was not broken even in a case where a 500 g of weight was placed.

Example 3

In the manufacturing of the conductive laminate 1 of Example 1, a conductive laminate 3 (thickness of metal layer: 1.0 µm, line width: 8 µm) was obtained in the same manner as in Example 1, except that the flexible substrate 1 with a to-be-plated layer precursor layer was subjected to UV irradiation to obtain a flexible substrate with a patterned layer to be plated, then was bonded to one main surface of the acryl plate, to form a support 3 with a patterned layer to be plated, instead of bonding the flexible substrate 1 with a to-be-plated layer precursor layer to an acrylic plate and performing UV irradiation to form the support 1 with a patterned layer to be plated. In a case where a capacitive touch sensor was manufactured with this conductive laminate 3 in the same manner as in Example 1, the sensor was driven without a problem, and the hemispherical portion was not broken even in a case where a 500 g of weight was placed.

Example 4

A conductive laminate 4 (thickness of metal layer: 1.0 μm, line width: 8 μm) was obtained in the same manner as in Example 2, except that the flexible substrate 1 with a to-be-plated layer precursor layer was subjected to UV irradiation to obtain a flexible substrate with a patterned layer to be plated, and then the flexible substrate with a patterned layer to be plated was bonded to both main surfaces of the acrylic plate, so as to form a support 4 with a patterned layer to be plated, instead of bonding the flexible substrates 1 with a to-be-plated layer precursor layers to the both main surfaces of the acrylic plate and performing UV irradiation so as to form the support 2 with a patterned layer to be plated, in the manufacturing of the conductive laminate 2 in Example 2. In a case where a touch sensor was manufactured with this conductive laminate 4 in the same manner as in Example 1, the sensor was driven without a problem, and the hemispherical portion was not broken even in a case where a 500 g of weight was placed.

Comparative Example 1

A conductive laminate C1 was manufactured in the same manner as in Example 1, except that the flexible substrate 1 with a to-be-plated layer precursor layer was not bonded to an acrylic plate in the manufacturing of the conductive laminate 1 of Example 1. In a case where a touch sensor was manufactured with this conductive laminate C1 in the same manner as in Example 1, the resultant was driven as a sensor, but in a case where a 500 g of weight was placed, the hemispherical portion was broken and thus was not practical.

EXPLANATION OF REFERENCES 11, 16: roll
12: flexible substrate
13: to-be-plated layer precursor layer
14: coating device
15: heating device
20: the flexible substrate with a to-be-plated layer precursor layer
30, 100: the support with a to-be-plated layer precursor layer
31: support
40, 110, 170, 180: the support with a patterned layer to be plated
41: patterned layer to be plated
60: support with a plated layer having hemispherical shape
61: support with flexible substrate
80, 130: conductive laminate having hemispherical shape
81: patterned layer to be plated to which the plating catalyst or the precursor thereof is applied
82: patterned metal layer
150: flexible substrate with patterned layer to be plated
201: thin wire
202: lattice

What is claimed is:
1. A method of manufacturing a conductive laminate having a three-dimensional shape, the method comprising:
a step A1 of extracting a long flexible substrate from a roll on which the flexible substrate is wound, and forming a to-be-plated layer precursor layer on at least one main surface of the flexible substrate while the extracted flexible substrate is transported in the longitudinal direction to obtain a flexible substrate with a to-be-plated layer precursor layer;
a step B1 of preparing a support and bonding the flexible substrate with a to-be-plated layer precursor layer to at least one main surface of the support to obtain a support with a to-be-plated layer precursor layer;
a step C1 of applying energy to the support with a to-be-plated layer precursor layer to obtain a support with a patterned layer to be plated;
a step D1 of deforming the support with a patterned layer to be plated such that at least a portion of the patterned layer to be plated is deformed to form a three-dimensional shape including a curved surface; and
a step E1 of performing a plating treatment on the patterned layer to be plated to form a patterned metal layer on the patterned layer to be plated,
wherein the to-be-plated layer precursor layer contains a functional group interacting with a plating catalyst or a precursor thereof and a polymerizable group, and
a step F1 of applying a plating catalyst or a precursor thereof to the patterned layer to be plated is further provided before the plating treatment, or the to-be-plated layer precursor layer contains a plating catalyst or a precursor thereof.

2. The method of manufacturing a conductive laminate having a three-dimensional shape according to claim 1, wherein, in the step B1, the flexible substrates with a to-be-plated layer precursor layer are bonded to both main surfaces of the support.

3. The method of manufacturing a conductive laminate having a three-dimensional shape according to claim 1, further comprising:
dehydrating at least the support before the support with a patterned layer to be plated is deformed.

4. The method of manufacturing a conductive laminate having a three-dimensional shape according to claim 1, wherein the to-be-plated layer precursor layer is formed by coating at least one main surface of the flexible substrate with a layer to be plated forming composition,
the layer to be plated forming composition contains a compound X or a composition Y,
the compound X is a compound having a functional group interacting with a plating catalyst or a precursor thereof and a polymerizable group, and
the composition Y is a composition containing a compound having a functional group interacting with a plating catalyst or a precursor thereof and a compound having a polymerizable group.

5. The method of manufacturing a conductive laminate having a three-dimensional shape according to claim 1, wherein a width of the patterned metal layer is 10 μm or less.

6. The method of manufacturing a conductive laminate having a three-dimensional shape according to claim 2, further comprising:
dehydrating at least the support before the support with a patterned layer to be plated is deformed.

7. The method of manufacturing a conductive laminate having a three-dimensional shape according to claim 2, wherein the to-be-plated layer precursor layer is formed by coating at least one main surface of the flexible substrate with a layer to be plated forming composition, the layer to be plated forming composition contains a compound X or a composition Y, the compound X is a compound having a functional group interacting with a plating catalyst or a precursor thereof and a polymerizable group, and the composition Y is a composition containing a compound having a functional group interacting with a plating catalyst or a precursor thereof and a compound having a polymerizable group.

8. The method of manufacturing a conductive laminate having a three-dimensional shape according to claim 2, wherein a width of the patterned metal layer is 10 μm or less.

9. The method of manufacturing a conductive laminate having a three-dimensional shape according to claim 6, wherein the to-be-plated layer precursor layer is formed by coating at least one main surface of the flexible substrate with a layer to be plated forming composition, the layer to be plated forming composition contains a compound X or a composition Y, the compound X is a compound having a functional group interacting with a plating catalyst or a precursor thereof and a polymerizable group, and the composition Y is a composition containing a compound having a functional group interacting with a plating catalyst or a precursor thereof and a compound having a polymerizable group.

10. The method of manufacturing a conductive laminate having a three-dimensional shape according to claim 9, wherein a width of the patterned metal layer is 10 μm or less.

11. A method of manufacturing a conductive laminate having a three-dimensional shape, the method comprising:

a step A2 of extracting a long flexible substrate from a roll on which the flexible substrate is wound, and forming a to-be-plated layer precursor layer on at least one main surface of the flexible substrate while the extracted flexible substrate is transported in the longitudinal direction to obtain a flexible substrate with a to-be-plated layer precursor layer;

a step B2 of applying energy to the flexible substrate with a to-be-plated layer precursor layer to obtain a flexible substrate with a patterned layer to be plated;

a step C2 of preparing a support and bonding the flexible substrate with a patterned layer to be plated on at least one main surface of the support to obtain a support with a patterned layer to be plated;

a step D2 of deforming the support with a patterned layer to be plated such that at least a portion of the patterned layer to be plated is deformed to form a three-dimensional shape including a curved surface; and a step E2 of performing a plating treatment on the patterned layer to be plated and forming a patterned metal layer on the patterned layer to be plated, wherein the to-be-plated layer precursor layer contains a functional group interacting with a plating catalyst or a precursor thereof and a polymerizable group, and a step F2 of applying a plating catalyst or a precursor thereof to the patterned layer to be plated is further provided before the plating treatment, or the patterned layer to-be-plated precursor layer contains a plating catalyst or a precursor thereof.

12. The method of manufacturing a conductive laminate having a three-dimensional shape according to claim 11, further comprising:

dehydrating at least the support before the support with a patterned layer to be plated is deformed.

13. The method of manufacturing a conductive laminate having a three-dimensional shape according to claim 11, wherein the to-be-plated layer precursor layer is formed by coating at least one main surface of the flexible substrate with a layer to be plated forming composition, the layer to be plated forming composition contains a compound X or a composition Y, the compound X is a compound having a functional group interacting with a plating catalyst or a precursor thereof and a polymerizable group, and the composition Y is a composition containing a compound having a functional group interacting with a plating catalyst or a precursor thereof and a compound having a polymerizable group.

14. The method of manufacturing a conductive laminate having a three-dimensional shape according to claim 11, wherein a width of the patterned metal layer is 10 μm or less.

* * * * *